US007862850B2

(12) United States Patent
Kenmoku et al.

(10) Patent No.: US 7,862,850 B2
(45) **Date of Patent: *Jan. 4, 2011**

(54) PAINTING METHOD

(75) Inventors: Yasuyuki Kenmoku, Kakegawa (JP); Takehito Katsunuma, Yokohama (JP)

(73) Assignee: ABB K.K., Tokyo (JP)

( * ) Notice: Subject to any disclaimer, the term of this patent is extended or adjusted under 35 U.S.C. 154(b) by 936 days.

This patent is subject to a terminal disclaimer.

(21) Appl. No.: 10/581,520

(22) PCT Filed: May 24, 2005

(86) PCT No.: PCT/JP2005/009826

§ 371 (c)(1),
(2), (4) Date: Jun. 2, 2006

(87) PCT Pub. No.: WO2005/118155

PCT Pub. Date: Dec. 15, 2005

(65) Prior Publication Data

US 2007/0134429 A1 Jun. 14, 2007

(30) Foreign Application Priority Data

Jun. 1, 2004 (JP) ............................ 2004-163601

(51) Int. Cl.
*C23C 16/52* (2006.01)
*B05D 1/02* (2006.01)

(52) U.S. Cl. ........................................ 427/8; 427/421.1

(58) Field of Classification Search ..................... 427/8, 427/421.1
See application file for complete search history.

(56) References Cited

U.S. PATENT DOCUMENTS 4,714,044 A * 12/1987 Kikuchi et al. .............. 118/314

FOREIGN PATENT DOCUMENTS

| | | | |
|---|---|---|---|
| JP | 06-262564 | * | 9/1994 |
| JP | 6-262564 | | 9/1994 |
| JP | 8-224539 | | 9/1996 |
| JP | 9-52067 | | 2/1997 |
| JP | 2003-144990 | * | 5/2003 |

OTHER PUBLICATIONS

Naoki "Teachingless Spray-Painting of Sculptured Surface by Industrial Robot" Apr. 1997, Intl. Conf. on Robotics and Automation p. 1875-1879.*

U.S. Appl. No. 10/581,297, filed Jun. 1, 2006, Kenmoku, et al.

* cited by examiner

*Primary Examiner*—Timothy H Meeks
*Assistant Examiner*—Mandy C Louie
(74) *Attorney, Agent, or Firm*—Oblon, Spivak, McClelland, Maier & Neustadt, L.L.P.

(57) ABSTRACT

A panel (9) is conveyed by using a conveyer (3), and the coating surface of the panel (9) is divided into two coating areas (CAa, CAb). Further, the coating areas (CAa, CAb) are coated by reciprocating sprayer units (6, 7) parallel to a conveying direction. At this time, at a boundary between the coating areas (CAa, CAb), the positions of turning paths (Ta0, Tb0) of the reciprocation of a coating machine are shifted sequentially from the front side to the rear side in the conveying direction, so that coating trajectories (Ta, Tb) like a series of steps are formed. Thus, at the boundary between the coating areas (CAa, CAb), the turning paths (Ta0, Tb0) can be spread and located, and the occurrence of color shading can be prevented.

7 Claims, 16 Drawing Sheets

PAINTING METHOD

TECHNICAL FIELD

The present invention relates to a coating method on employing sprayer unit to apply paint to an object to be coated, such as a body of an automobile, furniture or an electric appliance.

BACKGROUND ART

Generally, for the spray coating of an object having a comparatively large coating surface, like a body of an automobile, furniture or electrical appliances, a coating method has been known to perform coating the coating surface of the object is divided into a plural number of segments (see, for example, Japanese Patent Laid-Open No. Hei 9-52067 and Hei 2003-144990).

Disclosed in Japanese Patent Laid-Open No. Hei 9-52067 is an arrangement to provide two sprayer units at right and left end sides of the body of an automobile, and the upper surface of the vehicular body is coated after being divided into right and left coating areas. According to the arrangement in this case, the two sprayer units are reciprocated laterally of the vehicular body, coating individual coating areas, and return to the boundary between the two coating areas. At this time, since the spray patterns of the two sprayer units interfere with each other at the boundary of the coating areas, the coating film is thicker than at other coated portions, and this causes a coating failure, such as color shading. Therefore, according to the prior art in cited patent literature 1, at the boundaries of the coating areas, where the spray patterns of the two sprayer units interfere with each other, the sprayer units are gradually away from the coating surface to prevent an excessive increase in the thickness of the coated film.

On the other hand, according to an arrangement described in Japanese Patent Laid-Open No. 2003-144990, to prevent an increase in the thickness of a coated film at the boundaries of coating areas, the positions of the turning paths for reciprocation are alternately shifted to the right and to the left to form coating trajectories having a comb-toothed shape. Further, the spray of paint by the individual sprayer units is cut at the turning paths.

Then, factors related to the finished coating properties, such as the number of laminations of spray patterns and the thickness of the coated film, are different between portions that the sprayer units are moved parallel (parallel transit paths) during reciprocation and the turning paths for the reciprocation of the sprayer units. Therefore, in the prior art, at the turning paths for the reciprocation of the sprayer units, factors related to finished coating properties, such as the timing for the supply of paint and the stop of the supply (ON and OFF), the size of the spray pattern, the discharge quantity and the coating distance, are compoundly changed in order to obtain a uniform quality for the finished coating across the entire surface.

However, according to the coating method described in Japanese Patent Laid-Open No. Hei 9-52067, the sprayer units are away from the coating surface at the turning paths for the reciprocation of the sprayer units. Therefore, the spray pattern is extended, compared with the parallel transit path. As a result, the coated film has a uniform thickness, however color shading tends to occur.

Furthermore, according to the coating method described in Japanese Patent Laid-Open No. 2003-144990, although substantially the same spray pattern as in the parallel transit path can be used at the turning paths, the coated film thereat tends to be thicker than in the parallel transit path because the coating trajectories, which have comb-toothed shapes overlap each other at the boundaries of the two coating areas. As described above, according to the prior art, the finished coating quality across the entire coated surface can not always be appropriately uniform.

Especially, for the deposition of a coated film, a so-called metallic paint that contains a high luminance pigment, such as mica powder or aluminum powder, greatly influences the finish of a coat. Thus, when a metallic paint is employed, a problem is occurred that deterioration of the finished coating is noticeable at the turning paths at the boundaries of adjacent coating areas, and accordingly, the finished coating quality tends to be reduced across the entire coated surface.

DISCLOSURE OF THE INVENTION

In view of the above-discussed problems with the prior art, it is an object of the present invention to provide a coating method that can improve the finished coating at the boundaries of multiple coating areas, and that can increase the finished coating quality across the entire coated surface.

(1) According to the present invention, to achieve the above-stated objectives, a coating method for coating a surface of an object to be coated by means of dividing the coating surface into a plural number of coating areas and coating each of the coating areas while reciprocation of a sprayer unit, characterized in that:

sequentially shifting positions of turning paths for reciprocation of the sprayer unit in one of two directions of the reciprocation and coating a specific area of the divided coating areas, while forming coating trajectory of the turning paths like a series of steps; and sequentially shifting the positions of the turning paths for the reciprocation of the sprayer unit in the one direction to avoid overlapping with the turning paths in the specific coating area and coating a different coating area which is adjacent to the specific coating area, while forming the coating trajectory of the turning paths like the series of steps.

According to this arrangement, since the locations of the turning paths for the reciprocation of the sprayer unit are sequentially shifted in a predetermined direction and the coating trajectory at the turning paths is formed like a series of steps during performing coating, the turning paths can be arranged at dispersion state. As a result, for example, compared with the cases, that the turning paths are arranged at the same locations of the reciprocating direction or the turning paths are moved alternately in the two directions of the reciprocation, the color shading on the entire coated surface can be reduced and the finished coating quality can be improved.

Furthermore, for example, when the sprayer units are reciprocated substantially parallel in coating areas that are adjacent to each other, a coating trajectory obtained when one coating area is painted and a coating trajectory obtained when another coating area is painted can be continued substantially linearly with the turning paths. Thus, the same finished quality can be as obtained as is acquired when the entire coating surface is regarded as a single coating area.

(2) According to the arrangement of the present invention, coating is performed in the manner that paint is sprayed by the sprayer unit at parallel transit path and is cut at the turning paths for the reciprocation during the reciprocation of the sprayer unit.

As described above, since spraying of paint by the sprayer unit is cut at the turning paths for the reciprocation, the thickness of the coated film at the turning paths can be reduced, compared with the case of the spraying a paint is continued at the turning paths. As a result, the thickness of the coated film at turning paths can be nearly the same thickness as the coated film at the parallel transit path. Thus, color shading by unevenness can be prevented by linking the coating trajectory in two adjacent coating areas and the finished coating quality for the entire coating surface, which consists of two coating areas, can be increased.

(3) According to the arrangement of the present invention, conveying means for moving the object to be coated in a predetermined conveying direction is provided while the sprayer unit has reciprocated in a direction substantially parallel to the conveying direction of the object to be coated, the locations of the turning paths may be sequentially shifted from the front side to the rear side in the conveying direction of the object.

As described above, since the locations of the turning paths are sequentially shifted from front side to rear side in the conveying direction of the object, the range which a single sprayer unit can apply paint can be extended, compared with the case that the locations of the turning paths are fixed. Thus, the number of sprayer unit required for an entire coating line can be reduced, and equipment expenses for the coating line and maintenance expenses for the sprayer units can be reduced.

BEST MODE FOR CARRYING OUT THE INVENTION

Hereafter, with reference to the accompanying drawings, a detailed explanation will be given more particularly by employing cases wherein an object is to be coated by use of coating methods according to the embodiments of the present invention.

Referring first to FIGS. 1 to 8, there is shown a first embodiment of the present invention. An explanation will be given for the first embodiment by using an example wherein a rotary atomizing type sprayer unit attached to robot devices is employed to coat a panel consisting an external surface of a comparatively large furniture item or an electric appliance, for example.

Figure 1:
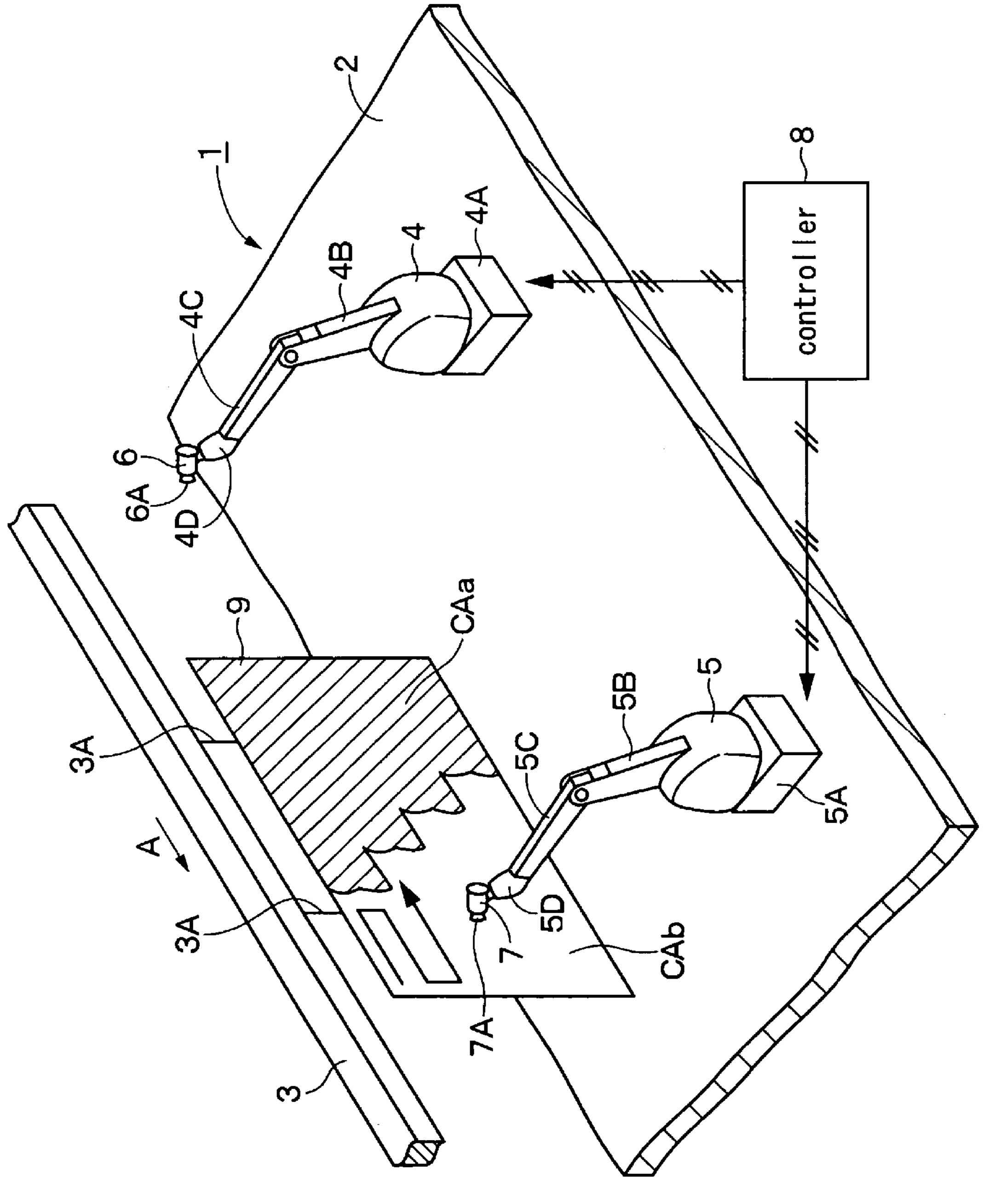
FIG. 1 is a perspective view of a coating apparatus used for a coating method according to a first embodiment of the present invention.

In FIG. 1, indicated at 1 is a coating apparatus located inside a coating booth 2. The coating apparatus 1 is roughly constituted by a conveyer 3, robot devices 4, 5, and a rotary atomizing type sprayer units 6, 7, all of which will be described after.

Figure 2:
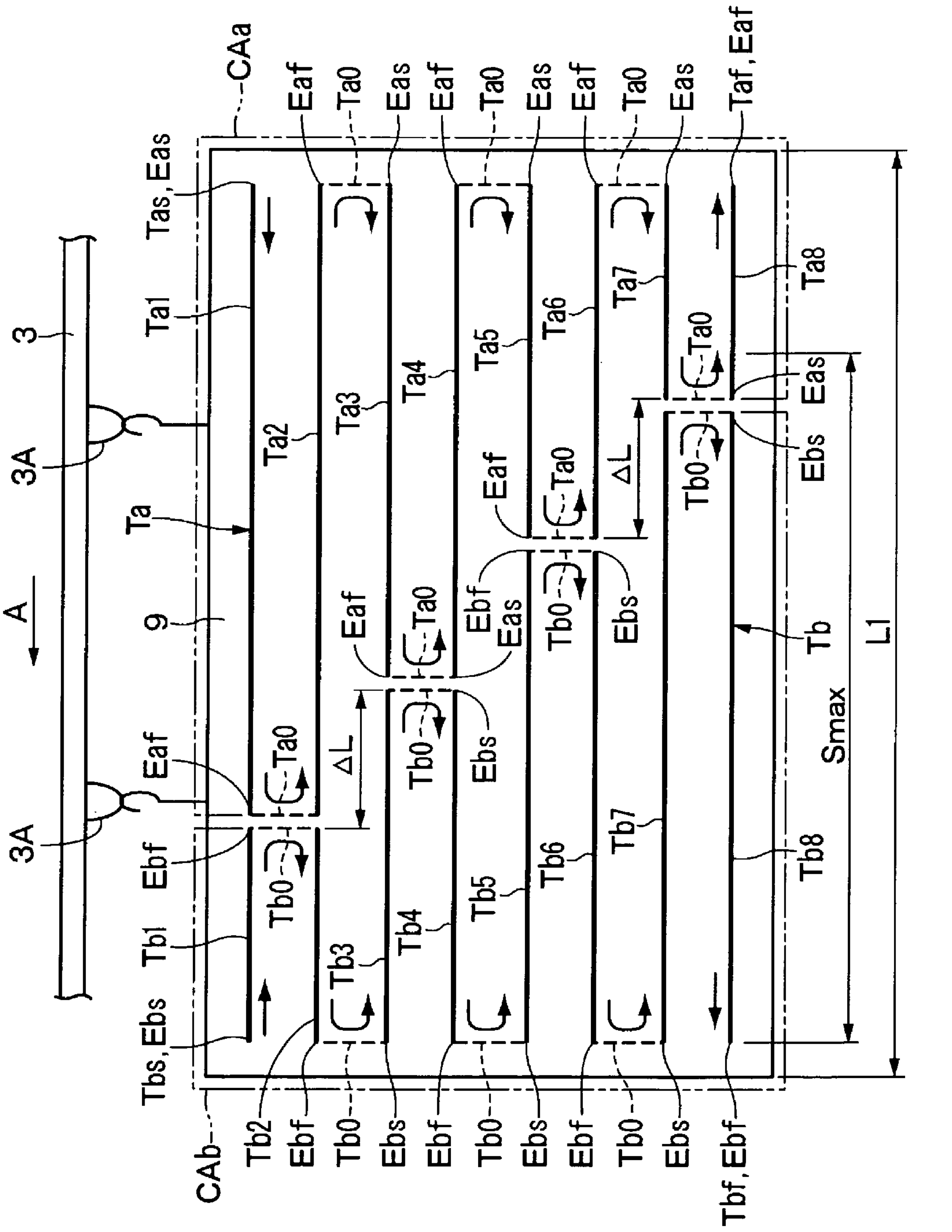
FIG. 2 is a front view of the coating trajectories of a rotary atomizing type sprayer unit for coating a panel in FIG. 1.

Indicated at 3 is a conveyer provided on the side of the ceiling of the coating booth 2. As shown in FIG. 2, the conveyer 3 is equipped with hangers 3A to suspend a panel 9 which will be described later. In this state, the panel 9 is conveyed at a predetermined speed in a direction indicated, for example, by an arrow A (from the right to the left in FIG. 2).

Indicated at 4, 5 are robot devices of a multi-axial type that constitute operating devices for sprayer units. The robot devices 4, 5 are located along and to the sides of the conveyer 3. Furthermore, the two robot devices 4, 5 are arranged at an interval to the rear side and to the front side in the conveying direction (the direction indicated by the arrow A) of the conveyer 3, and move the rotary atomizing type sprayer units 6, 7, which will be described later to perform a coating operation.

The robot device 4 is roughly constituted by a base 4A, a vertical arm 4B rotatably and swingably mounted on the base 4A, a horizontal arm 4C swingably mounted at the distal end of the vertical arm 4B, and a wrist 4D provided at the distal end of the horizontal arm 4C. Substantially the same as the robot device 4, the robot device 5 is also roughly constituted by a base 5A, a vertical arm 5B, a horizontal arm 5C and a wrist 5D.

Besides, a robot device 4 may be attached to a tracking mechanism (not shown) provided parallel to the conveyer 3. In this case, the tracking mechanism is extended parallel to the conveying direction of the conveyer 3 to move the robot devices 4, 5 independently at arbitrary speeds in the conveying direction or in the opposite direction. With this arrangement, the tracking mechanism can adjust the movement speeds of the robot devices 4, 5 (sprayer units 6, 7) relative to the panel 9 which is conveyed by the conveyer 3.

In addition, the robot devices 4, 5 support the rotary atomizing type sprayer units 6,7 at the wrists 4D, 5D. When the panel 9 which will be described later is conveyed to a coating position by the conveyer 3, the robot devices 4, 5 move the vertical arms 4B, 5B and the horizontal arms 4C, 5C to reciprocate the sprayer units 6, 7 substantially parallel to the conveying direction along the panel 9 within the range of a maximum stroke width Smax.

Indicated at 6, 7 are the rotary atomizing type sprayer units respectively attached to the wrists 4D, 5D of the two robot devices 4, 5. At a fore end portion, the sprayer units 6, 7 provide with rotary atomizing heads 6A, 7A that are rotated at a high speed. The sprayer units 6, 7 are constructed by the following function, when paint is discharged toward the rotary atomizing heads 6A, 7A, the paint is atomized to fine particles by the centrifugal forces of the rotary atomizing heads 6A, 7A and the fine particles of paint are sprayed on the panel 9 located to the front.

Furthermore, shaping air spouting holes (not shown) are located at the outer side of the rotary atomizing heads 6A, 7A of the sprayer units 6, 7. Through the shaping air spouting holes, shaping air is spouted from the rear side as enclosing the paint sprayed from the rotary atomizing heads 6A, 7A. As described above, the shaping air is used to prevent the paint which has been sprayed through the rotary atomizing heads 6A, 7A from spreading outward due to centrifugal force, and to form a circular atomizing pattern P (a spray pattern) of paint having a predetermined diameter.

Indicated at 8 is a controller connected to the robot devices 4, 5 (the sprayer units 6, 7) and placed in a control chamber that controls a coating line. In this case, the controller 8 is constituted, for example, by a computer having a program for controlling the robot devices 4, 5, the sprayer units 6, 7, an air control valve and a coating control valve (neither of them shown). The controller 8 adjusts the movements of the robot devices 4, 5 (the travel speeds of the sprayer units 6, 7), the quantities of the paint sprayed by the sprayer units 6, 7, the pressure of the ejected shaping air and so forth.

Indicated at 9 is a panel that is used as an object to be coated. The panel 9 is a plate having an almost quadrilateral shape used as an external plate of steel furniture or an electric appliance for example, and is sequentially conveyed in a direction indicated by an arrow A being suspended by the conveyer 3. Further, the panel 9 has a size L1 longer than the maximum stroke width Smax of the sprayer units 6, 7 in the conveying direction (the direction indicated by the arrow A) (see FIG. 2). The coating surface of the panel 9 is divided into two coating areas, CAa, CAb, which are located to the rear side (upstream) and to the front side (downstream) relative to the conveying direction. The individual coating area CAa is coated by the sprayer unit 6 located to the rear side relative to the conveying direction and the individual coating area CAb is coated by the sprayer unit 7 located to the front relative to the conveying direction, respectively.

The coating apparatus 1 in the first embodiment has been constituted as above described. In addition, with reference to FIGS. 2 to 8, an explanation will now be given for a coating method according to this embodiment by employing as an example the coating of the panel 9.

In FIGS. 2 through 8, solid lines and dotted lines (broken lines), which are drawn to describe lateral reciprocation paths across the coating surface of the panel 9, represent coating trajectories (travel trajectories) Ta, Tb of the sprayer units 6, 7 (rotary atomizing heads 6A, 7A) on the coating surface of the panel 9. Furthermore, the solid lines used for the coating trajectories Ta, Tb represent parallel transit paths Ta1 to Ta8, Tb1 to Tb8 that the sprayer units 6, 7 move parallel to the lateral direction. The dotted lines of the coating trajectories Ta, Tb represent turning paths Ta0, Tb0 where the sprayer units 6, 7 turn and move. Further, the sprayer units 6, 7 are constituted to spray paint along the parallel transit paths Ta1 to Ta8, Tb1 to Tb8, and to cut the spraying of paint at the turning paths Ta0, Tb0. In addition, the two sprayer units 6, 7 perform coating process sequences along the coating trajectories Ta, Tb while maintaining a speed corresponding to that of the panel 9 (the object), which will be described later.

Figure 3:
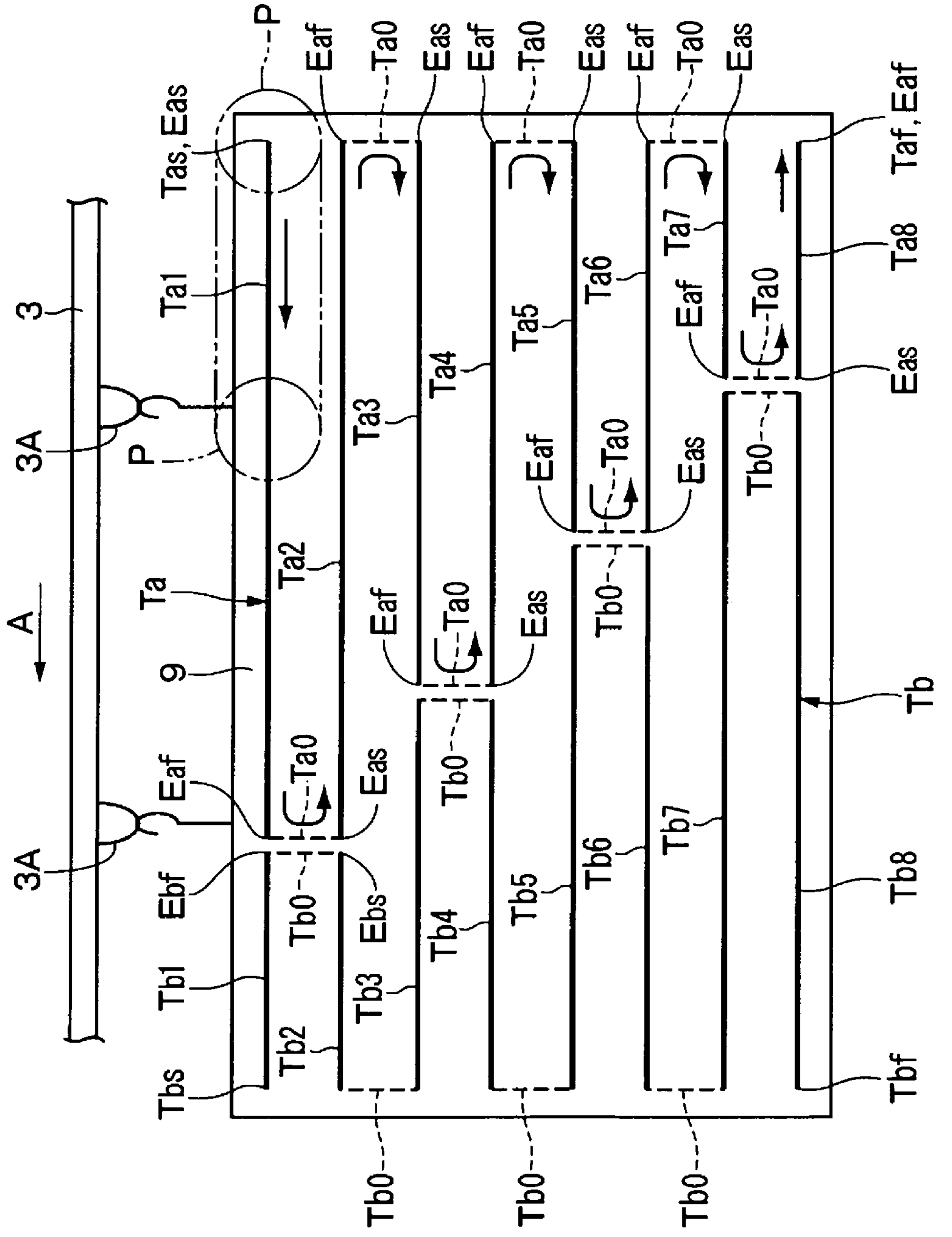
FIG. 3 is a front view of the state wherein coating is started for a coating area of a panel in FIG. 2 to the rear in a conveying direction.

Initially, a first coating process will be described while referring to FIGS. 2 through 5. During the first coating process, while the panel 9 is conveyed by the conveyer 3, the panel 9 is passed the vicinity of the sprayer unit 6 located upstream (to the rear side) in the conveying direction. At this time, the controller 8 begins the coating of the coating area CAa, which is the rear portion of the coating surface of the panel 9 in the conveying direction by using the robot device 4 and the sprayer unit 6 located to the rear side. Then, as shown in FIG. 3, the sprayer unit 6 is moved to the upper right corner of the panel 9 as a start position Tas of the coating trajectory Ta, and starts the spraying paint. As a result, the sprayer unit 6 forms a spray pattern P, and moves across the upper portion of the panel 9 along the first parallel transit path Ta1 to the left while the spraying of paint is continued.

Figure 4:
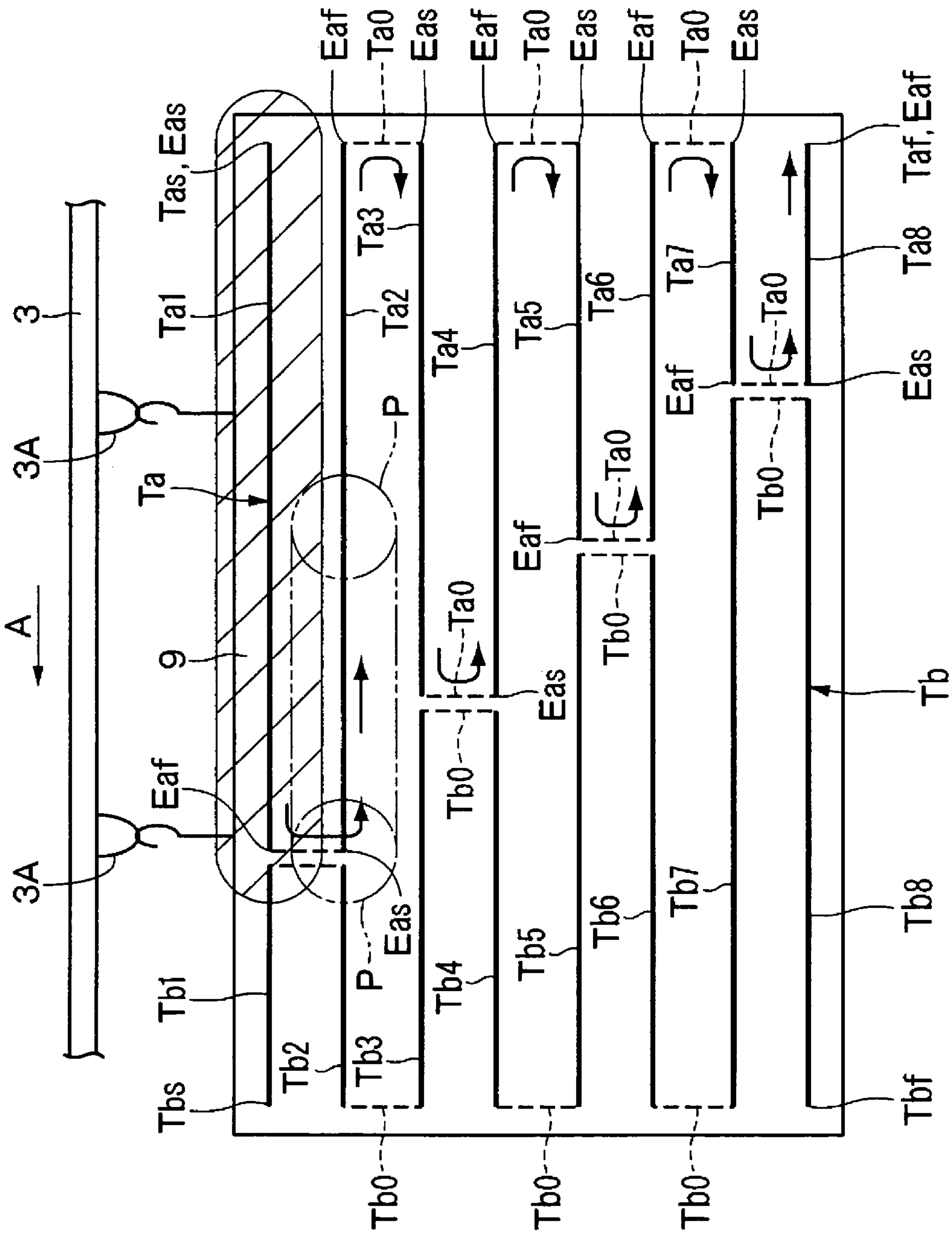
FIG. 4 is a front view, sequential to FIG. 3, of the state wherein a first turning path has been passed and a second parallel transit path is to be coated.

When the sprayer unit 6 has moved to the intermediate position of the panel 9 in the lateral direction and reached a terminal end Eaf of the parallel transit path Ta1, the sprayer unit 6 is positioned at a start end of the first turning path Ta0. Thus, as shown in FIG. 4, the sprayer unit 6 temporarily cuts the spraying of paint and moves downward on the panel 9 along the first turning path Ta0.

Then, the sprayer unit 6 is moved down from the parallel transit path Ta1 a distance that is smaller than the diameter of the spray pattern P, and it reaches the terminal end of the turning path Ta0. At this time, the sprayer unit 6 is located at a start end Eas of a second parallel transit path Ta2. Therefore, the sprayer unit 6 restarts the spraying of paint and moves to the right of the panel 9 along the second parallel transit path Ta2 while continuing the spraying of paint.

When the sprayer unit 6 has moved to the right end side of the panel 9 and has reached the terminal end Eaf of the parallel transit path Ta2, the sprayer unit 6 is positioned at the start end of the second turning path Ta0. Thus, the sprayer unit 6 temporarily cuts the spraying of paint and moves downward on the panel 9 along the second turning path Ta0.

Sequentially, when the sprayer unit 6 has reached the terminal end of the second turning path Ta0, the sprayer unit 6 is positioned at the start end Eas of a third parallel transit path Ta3. Therefore, the sprayer unit 6 restarts the spraying of paint, and moves to the left of the panel 9 along the third parallel transit path Ta3. When the sprayer unit 6 has reached the terminal end Eaf of the parallel transit path Ta3, the sprayer unit 6 temporarily cuts the spraying of paint as at the first turning point Ta0, and moves downward on the panel 9 along the third turning path Ta0.

At this time, as at the first turning path Ta0 that connects the parallel transit paths Ta1 and Ta2, the third turning path Ta0, which connects the parallel transit paths Ta3 and Ta4, is positioned near the boundary between the two coating areas CAa and CAb. However, the third turning path Ta0 is positioned to the rear side in the conveying direction (the direction indicated by the arrow A) further than the first turning path Ta0, and the two turning paths Ta0 are separated each other by a distance ΔL in the conveying direction (see FIG. 2).

Further, at the parallel transit path Ta3, as at the first turning path Ta0, the sprayer unit 6 moves downward a distance equivalent to the first turning path Ta0 and reaches the terminal end of the third turning path Ta0, for example. At this point, the sprayer unit 6 restarts the spraying of paint and moves to the right of the panel 9 along a fourth parallel transit path ta4 while continuing the spraying of paint.

In the same manner as the coating operation performed for the parallel transit path Ta1 to the parallel transit path Ta4, the sprayer unit 6 repeats the following coating operation. Specifically, at fifth to eighth parallel transit paths Ta5 to Ta8, the sprayer unit 6 moves parallel to the conveying direction while performing the spraying of paint, and at the fifth to seventh turning paths Ta0, the sprayer unit 6 cuts the spraying of paint and moves downward to the conveying direction. At this time, the positions of the fifth and seventh turning paths Ta0 are sequentially shifted as are those of the first and third turning paths Ta0 at distances ΔL, from the front side to the rear side in the conveying direction (see FIG. 2).

Figure 5:
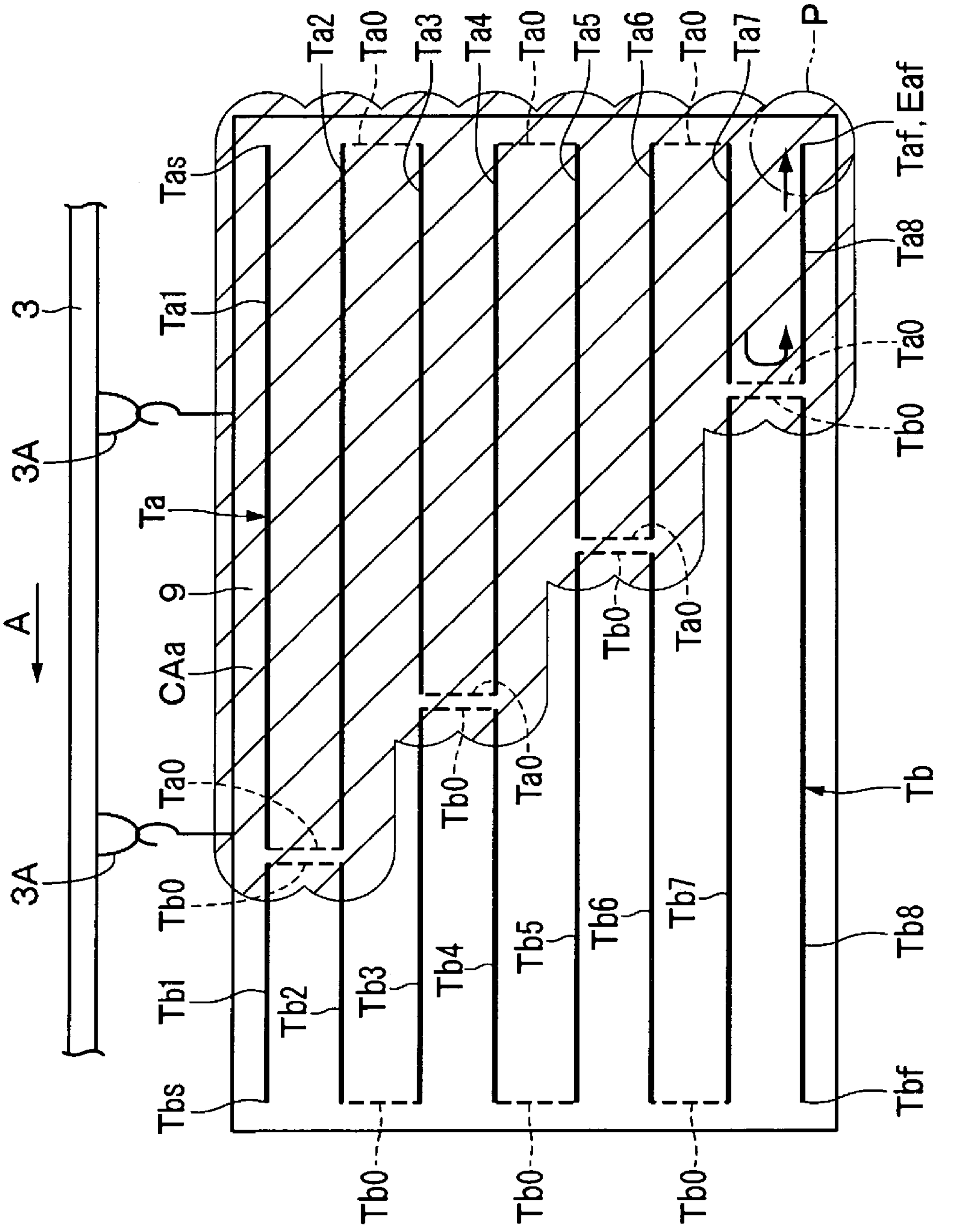
FIG. 5 is a front view of the state wherein coating has been completed for the coating area of the panel to the rear in the conveying direction.

Finally, as shown in FIG. 5, when the sprayer unit 6 has moved to the terminal end Eaf of the parallel transit path Ta8, the sprayer unit 6 is positioned at the lower right corner of the panel 9 in FIG. 2 as an end position Taf of the coating trajectory Ta. As a result, the sprayer unit 6 stops the spraying of paint at this position and ends the coating of the panel 9.

Figure 6:
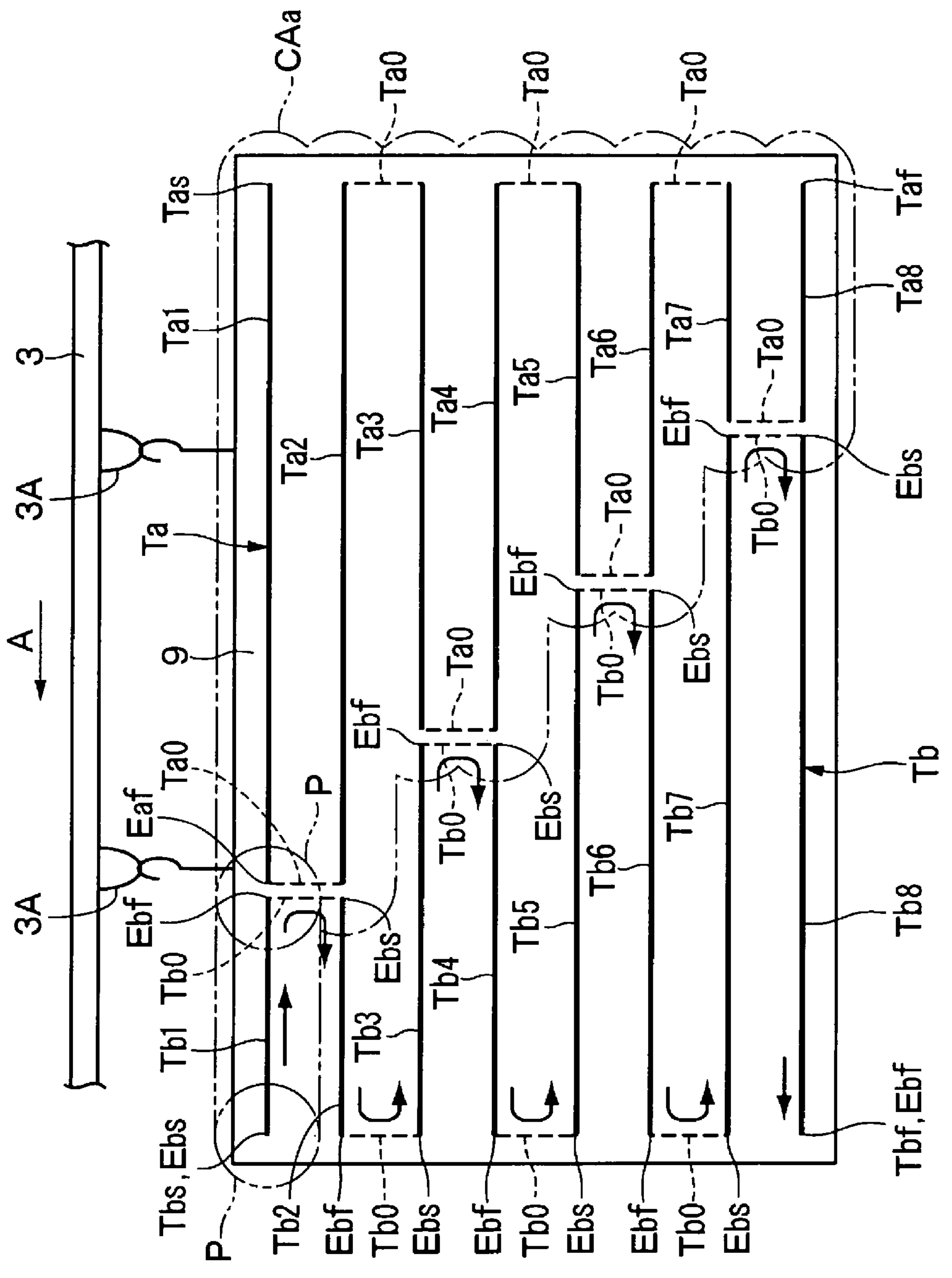
FIG. 6 is a front view of the state wherein coating is started for a coating area of the panel to the front in the conveying direction.

Next, a second coating process will be described while referring to FIGS. 2, 6 through 8. In the second coating process, when the panel 9 is conveyed by the conveyer 3 close to the sprayer unit 7 located to the front side (downstream) in the conveying direction, the controller 8 employs the robot device 5 and the sprayer unit 7 (the sprayer unit 7 on the left in FIG. 1) arranged to the front side thereof to begin coating the coating area CAb which is the front portion of the coating surface of the panel 9 in the conveying direction. At this time, as shown in FIG. 6, the sprayer unit 7 moves to the upper left corner of the panel 9 as a start position Tbs of the coating trajectory Tb and begins the spraying of paint. Thus, the sprayer unit 7 forms a spray pattern P and moves across the upper portion of the panel 9 to the right along the first parallel transit path Tb1 while the spraying of paint is continued.

Figure 7:
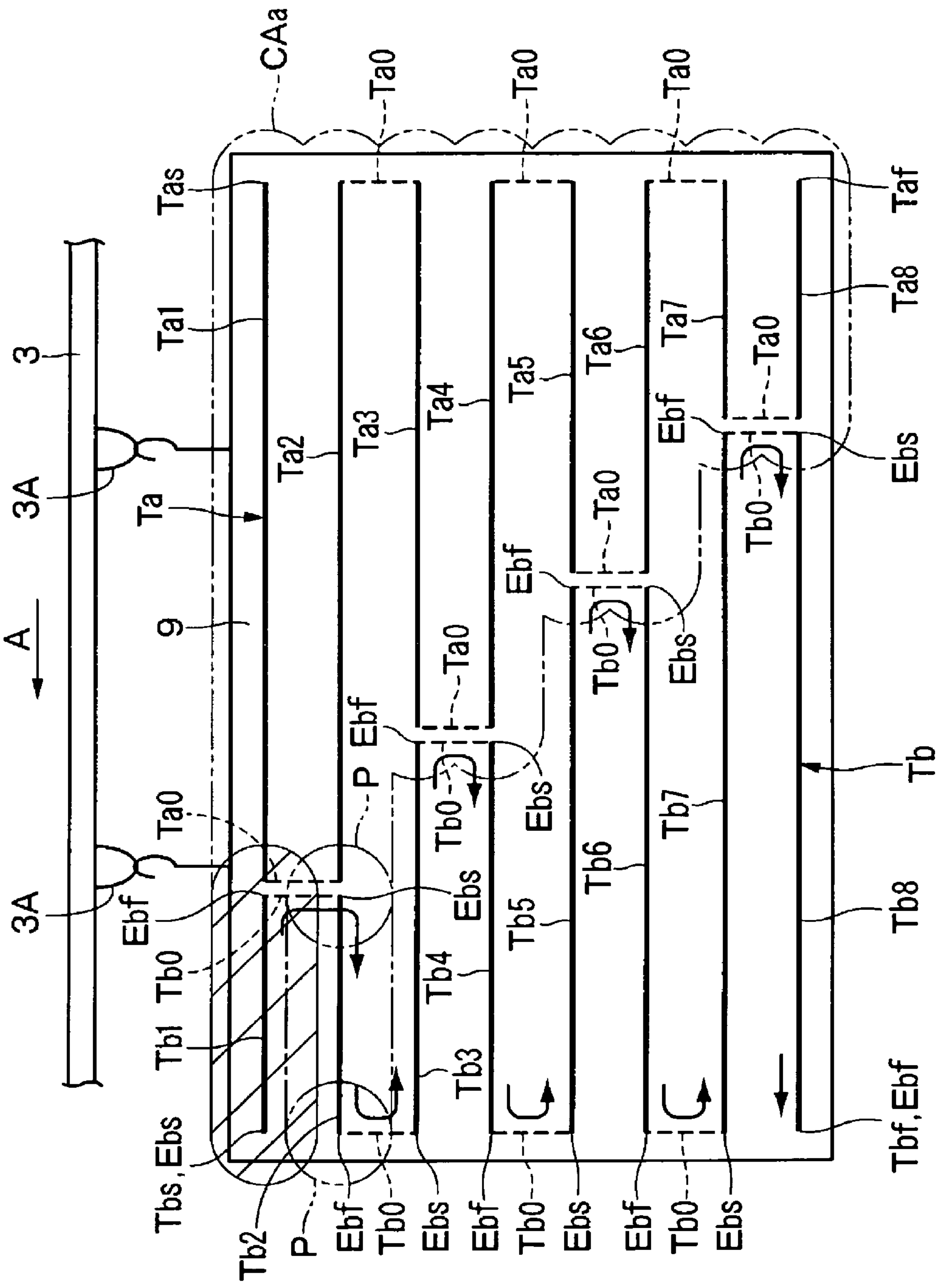
FIG. 7 is a front view, sequential to FIG. 6, of the state wherein the first turning path has been passed and the second parallel transit path is to be coated.

Following this, when the sprayer unit 7 has been moved to the intermediate position of the panel 9 in lateral direction and has reached a terminal end Ebf of the parallel transit path Tb1, the sprayer unit 7 is positioned at the start end of the first turning path Tb0. Thus, as shown in FIG. 7, the sprayer unit 7 temporarily cuts the spraying of paint and moves downward along the first turning path Tb0 of the panel 9. At this time, the terminal end Ebf of the parallel transit path Tb1 is positioned near the terminal end Eaf of the parallel transit path Ta1 which is transversely adjacent. These parallel transit paths Tb1 and Ta1 are aligned substantially linearly. The first turning path Tb0 is also located in the vicinity of the first turning path Ta0 which is transversely adjacent, and these two turning paths Tb0 and Ta0 are vertically extended substantially parallel to each other.

When the sprayer unit 7 has moved downward from the parallel transit path Tb1 a distance that is smaller than the diameter of the spray pattern P and has reached the terminal end of the first turning path Tb0, the sprayer unit 7 is positioned at a start end Ebs of the second parallel transit path Tb2. Thus, the sprayer unit 6 restarts the spraying of paint and moves to the left of the panel 9 along the second parallel transit path Tb2 while continuing the spraying of paint.

Sequentially, when the sprayer unit 7 has moved the left end of the panel 9 and has reached the terminal end Ebf of the parallel transit path Tb2, the sprayer unit 7 is positioned at the start end of the second turning path Tb0. Therefore, the sprayer unit 7 temporarily cuts the spraying of paint, and moves downward on the panel 9 along the second turning path Tb0.

Next, when the sprayer unit 7 has reached the terminal end of the second turning path Tb0, the sprayer unit 7 is positioned at the start end Ebs of the third parallel transit path Tb3. Thus, the sprayer unit 7 restarts the spraying of paint, and moves to the right of the panel 9 along the third parallel transit path Tb3. When the sprayer unit 7 has reached the terminal end Ebf of the parallel transit path Tb3, the sprayer unit 7 temporarily cuts the spraying of paint in the same manner as the first turning path Tb0, and moves downward on the panel 9 along the third turning path Tb0.

At this time, the third turning path Tb0 is located near the boundary between the two coating areas CAa and CAb same as the first turning path Tb0. However, the third turning path Tb0 is positioned at the rear side in the conveying direction (the direction indicated by the arrow A) further than the first turning path Tb0, and these two turning paths Tb0 are separated by the distance ΔL in the conveying direction (see FIG. 2).

Following this, at the parallel transit path Tb3, same as the first turning path Tb0, the sprayer unit 7 moves downward a distance equivalent to the first turning path Tb0, and reaches the terminal end of the third turning path Tb0. Then, the sprayer unit 7 restarts the spraying of paint and moves to the left on the panel 9 along the fourth parallel transit path Tb4 while continuing the spraying of paint.

In the same manner as the coating operation performed from the parallel transit path Tb1 to the parallel transit path Tb4, the sprayer unit 7 performs the following coating operation. Specifically, at fifth to eighth parallel transit paths Tb5 to Tb8, the sprayer unit 7 moves parallel to the conveying direction while performing the spraying of paint, and at the fifth to seventh turning paths Tb0, the sprayer unit 7 cuts the spraying of paint, and moves downward, vertically crossing to the conveying direction. At this time, the positions of the fifth and seventh turning paths Tb0 are sequentially shifted the distance ΔL from the front side to the rear side in the conveying direction, as the first and the third turning paths Tb0.

Figure 8:
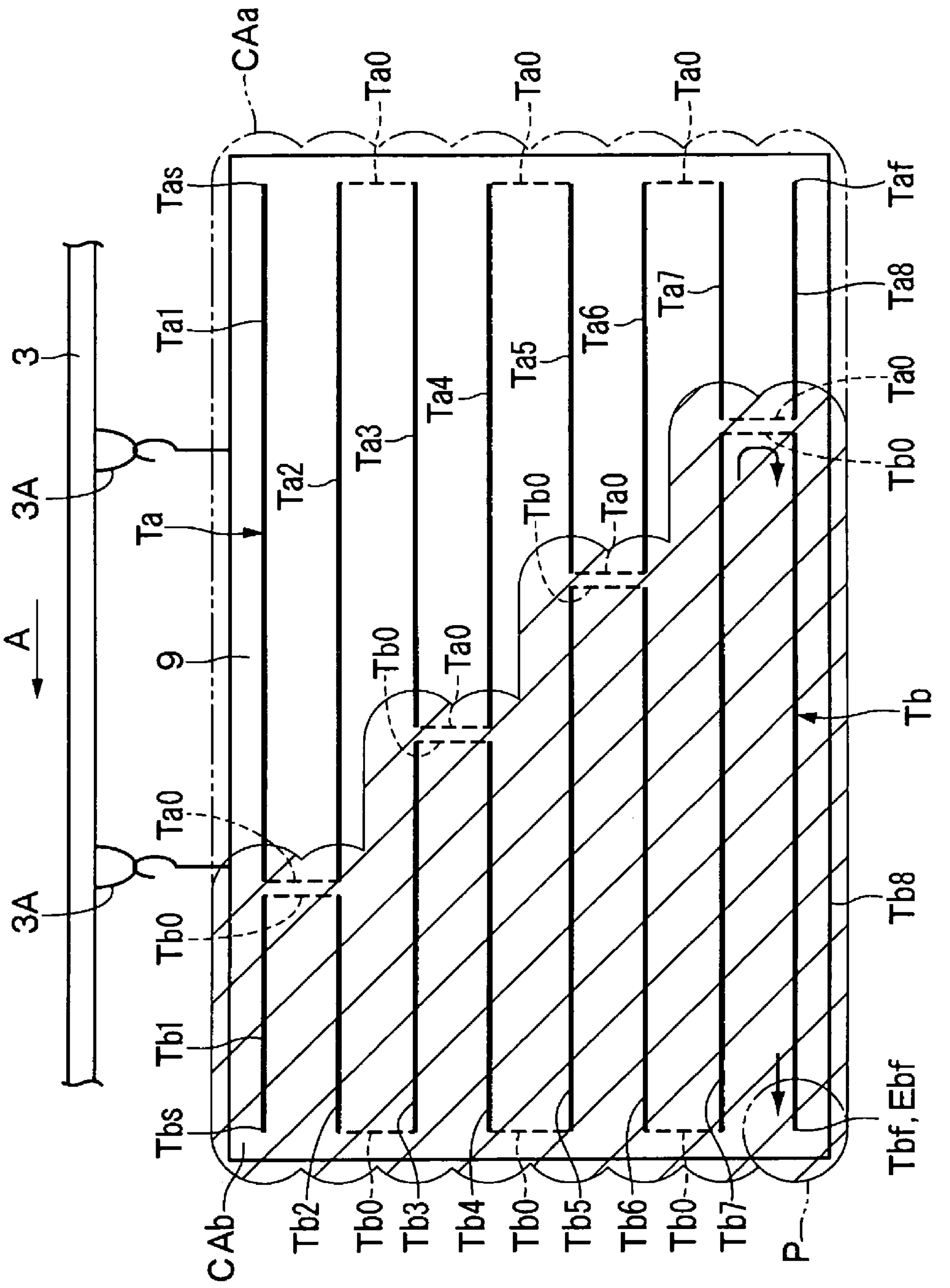
FIG. 8 is a front view of the state wherein coating has been completed for the coating area of the panel to the front in the conveying direction.

Finally, as shown in FIG. 8, when the sprayer unit 7 is moved to the terminal end Ebf of the parallel transit path Tb8, the sprayer unit 7 is positioned at the lower left corner of the panel 9 in FIG. 2 as an end position Tbf for the coating trajectory Tb. As a result, the sprayer unit 7 stops the spraying of paint at this position, and completes the coating of the panel 9.

Further, the sprayer unit 7 located to the front side (downstream) in the conveying direction may begin the coating operation for the coating area CAb either after the sprayer unit 6 located to the rear side (upstream) in the conveying direction has terminated the coating operation for the coating area CAa or while the sprayer unit 6 is performing the coating operation. That is, if the two sprayer units 6, 7 do not interfere with each other, the sprayer units 6, 7 may simultaneously perform the coating operation.

According to the arrangement of this embodiment, the positions of the turning paths Ta0 and Tb0 of the reciprocation of the sprayer unit 6, 7 are sequentially shifted in a predetermined direction to the opposite side of the conveying direction, and arranging the coating trajectories Ta, Tb of the turning paths Ta0, Tb0 like a series of steps. Therefore, for example, the third turning path Ta0, positioned between the parallel transit paths Ta3, Ta4 of the coating trajectory Ta in the coating area CAa, is located adjacent to the second parallel transit path Ta2. Therefore, when coating is performed along the parallel transit path Ta2, the obtained spray pattern P also overlaps with the third turning path Ta0.

Further, since the fifth parallel transit path Tb5 in the other coating area CAb is also located adjacent to the third turning path Ta0, when coating is performed along the fifth parallel transit path Tb5 in the other coating area CAb, the obtained spray pattern P also overlaps with the third turning path Ta0.

Similarly, spray patterns P obtained by coating the parallel transit paths Ta1 to Ta8, Tb1 to Tb8 overlap with at the turning paths Ta0, Tb0 that are located at the boundary between the two coating areas CAa, CAb. Thus, when coating is performed for the parallel transit paths Ta1 to Ta8, Tb1 to Tb8, all the spray patterns P according to this coating can be overlapped with the turning paths Ta0, Tb0.

As a result, the number of laminations produced by the spray patterns P at the turning paths Ta0, Tb0, the thickness of the coated film can be near to the other portions (the parallel transit paths Ta1 to Ta8, Tb1 to Tb8). Thus, color shading of unevenness at the turning paths Ta0, Tb0 can be reduced, and finished coating can be improved.

Figure 9:
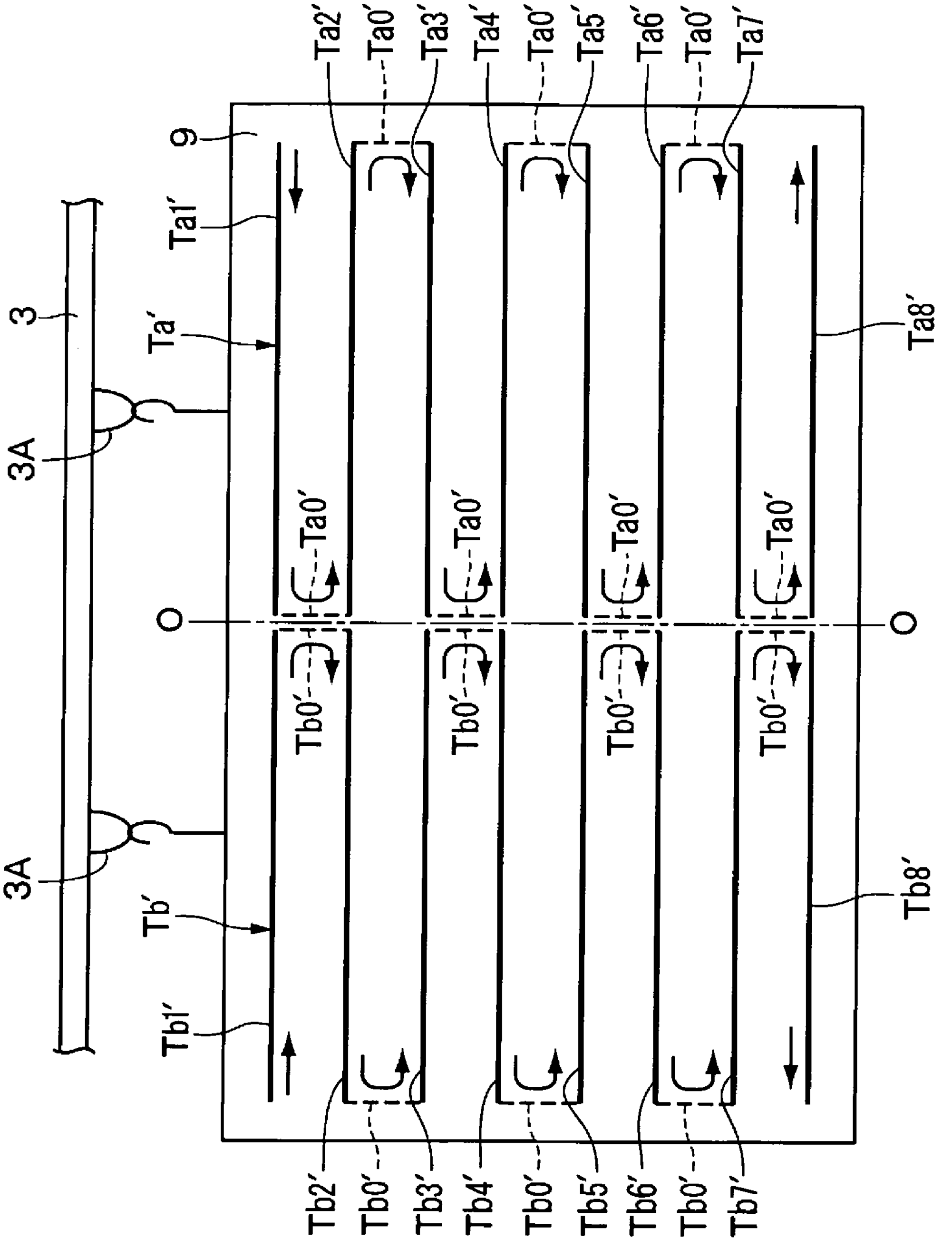
FIG. 9 is a front view of the coating trajectories of a sprayer unit for coating a panel by use of a coating method according to a first comparison example.
Figure 10:
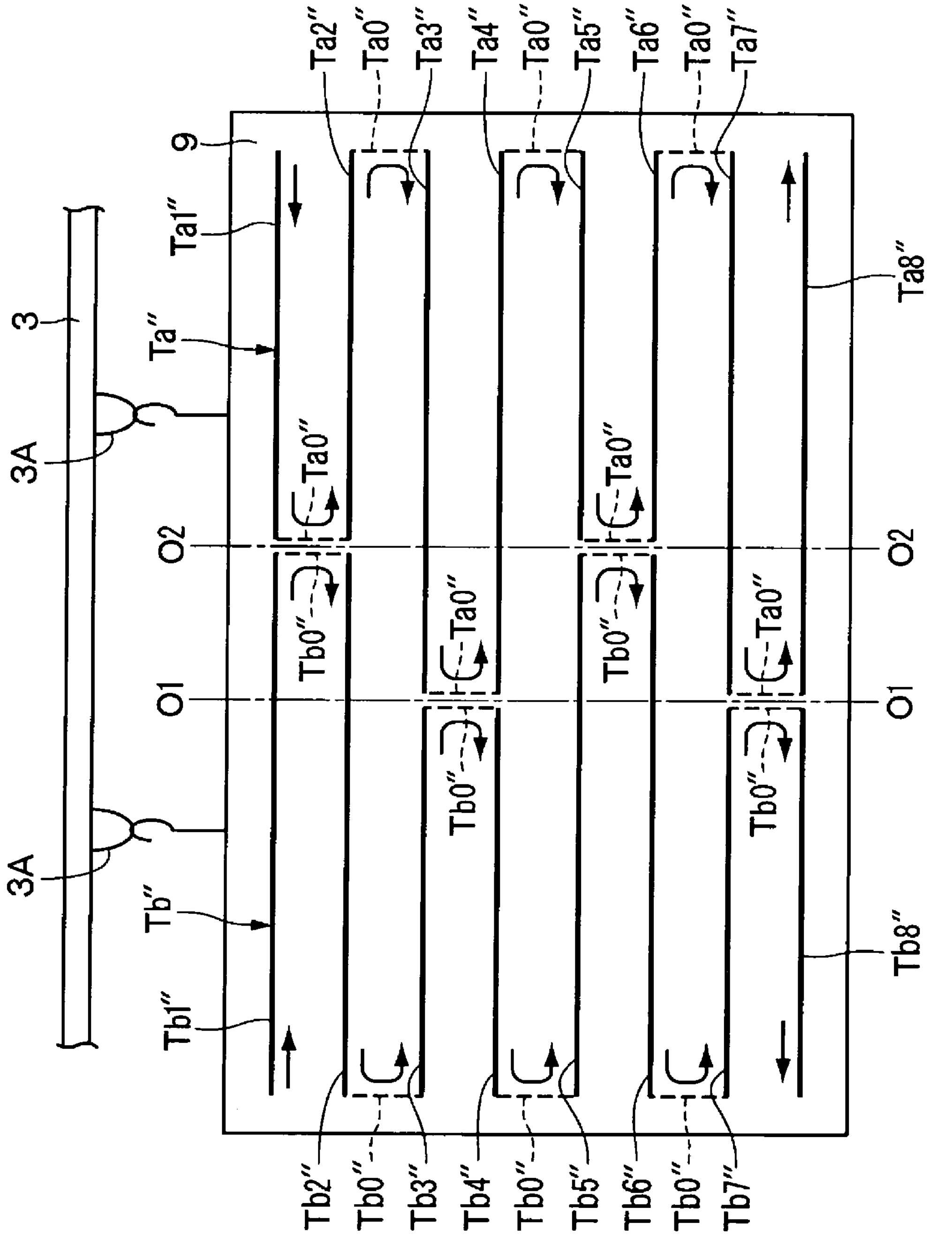
FIG. 10 is a front view of the coating trajectories of the sprayer unit for coating a panel by use of a coating method according to a second comparison example.

The finished coating of this embodiment shown in FIGS. 1 through 8 will be compared with a first comparison example and a second comparison example shown in FIGS. 9 and 10.

The first comparison example is shown in FIG. 9. According to the first comparison example, to form coating trajectories Ta', Tb', turning paths Ta0', Tb0' are positioned at the almost same locations on the panel 9 in lateral direction. In this case, the turning paths Ta0', Tb0' are concentrically located at one place in the center of the panel 9 in lateral direction. Therefore, in the first comparison example, as indicated by a chain line O in FIG. 9, a row of color shading portion tend to be formed.

On the other hand, the second comparison example is shown in FIG. 10. According to the second comparison example, turning paths Ta0", Tb0" are alternately moved to the intermediate position of the panel 9 in lateral direction to form coating trajectories Ta", Tb" having a comb-toothed shape (a zigzag shape). In this case, the turning paths Ta0", Tb0" are also located concentrically at two places in lateral direction. Thus, also in the second comparison example, as indicated by chain lines O1, O2 in FIG. 10, two rows of color shading portions tend to be formed.

On the contrary, according to the first embodiment, the coating trajectories Ta, Tb have a step-like form to shift the positions of the turning paths Ta0, Tb0 in a predetermined direction. As a result, the turning paths Ta0, Tb0 can be spread out and arranged on the panel 9, so that color shading by unevenness can be reduced across the entire coating surface and the quality of the finished coating can be increased.

Furthermore, the sprayer units 6, 7 reciprocate substantially parallel across the coating areas CAa, CAb which are adjacent to each other. Thus, the parallel transit paths Ta1 to Ta8 in the coating trajectory Ta obtained by the coating of the coating area CAa can be linearly continued along the parallel transit paths Tb1 to Tb8 in the coating trajectory Tb obtained by the coating of the other coating area CAb. Therefore, the quality of the finished coating is the same as when the coating surface of the panel 9 is regarded as a single coating area.

Further, according to the first embodiment, at the parallel transit paths Ta1 to Ta8, Tb1 to Tb8, the paint is sprayed by the sprayer units 6, 7, while at the turning paths Ta0, Tb0, the spraying of paint by the sprayer units 6, 7 is halted. Thus, the thickness of the film coat at the turning paths Ta0, Tb0 can be reduced compared with when the spraying of paint is continued at the turning paths Ta0, Tb0.

As a result, the thickness of the film coat at the turning paths Ta0, Tb0 can be near the thickness of the film coat at the parallel transit paths Ta1 to Ta8, Tb1 to Tb8. Therefore, in the two adjacent coating areas CAa, CAb, the parallel transit paths Ta1 to Ta8, Tb1 to Tb8 of the coating trajectories Ta, Tb can be linked, so that color shading by unevenness can be prevented at the linked portions. Consequently, the quality of the finished coating of the entire coating surface of the panel 9, which consists of the two coating areas CAa and CAb can be improved.

Moreover, according to the arrangement, the sprayer units 6, 7 reciprocate substantially parallel to the conveying direction of the panel 9, and the positions of the turning paths Ta0, Tb0 are sequentially shifted from the front side (downstream) to the rear side (upstream) in the conveying direction of the panel 9. Thus, the range of one sprayer unit 6, 7 for coating can be substantially expanded compared with the case to fix the positions of the turning paths Ta0, Tb0.

That is, as the panel 9 is conveyed, the panel 9 is gradually moved forward (downstream) from the facing positions of the sprayer units 6, 7. Therefore, as the sprayer units 6, 7 repeatedly reciprocate, the coating available ranges are gradually shifted to forward (downstream) of the conveying direction of the panel 9. Therefore, the positioning of the coating available ranges is obviously shifted between when the coating of the coating areas CAa, CAb was begun and when it is terminated.

Therefore, a comparison is made between this embodiment and a case wherein the positions of the turning paths are not changed as shown in FIG. 9. According to the first comparison example in FIG. 9, the coating available range of sprayer units are limited to the area where the coating available range at the start time and the coating available range at the end time are overlapped since the positions of the turning paths Ta0', Tb0' of the reciprocation are fixed without the positions being shifted. As a result, the range within which coating can be performed by a single sprayer unit is limited to a range smaller than the maximum stroke width Smax of this sprayer unit, and the available coating range is narrowed.

On the other hand, according to this embodiment, in the adjacent coating areas CAa, CAb, the positions of the turning paths Ta0, Tb0 for the reciprocation of the sprayer units 6, 7 are sequentially shifted from the front side to the rear side in the conveying direction of the panel 9. With this arrangement, even when the panel 9 is gradually moved away from the sprayer units 6, 7, as the sprayer units 6, 7 repeatedly reciprocate, the reciprocation range is gradually shifted to the rear side (upstream) in the conveying direction of the panel 9.

Thus, the available coating range of the sprayer units 6, 7 is not limited to the range wherein the coating available range at the coating start time and the coating available range at the coating end time are overlapped, and can be substantially extended. Therefore, the number of sprayer units 6, 7 required for the coating apparatus 1 (the entire coating line) can be reduced, and the expenses incurred to equip the coating apparatus 1 and to provide maintenance for the sprayer units 6, 7 can be reduced.

Figure 11:
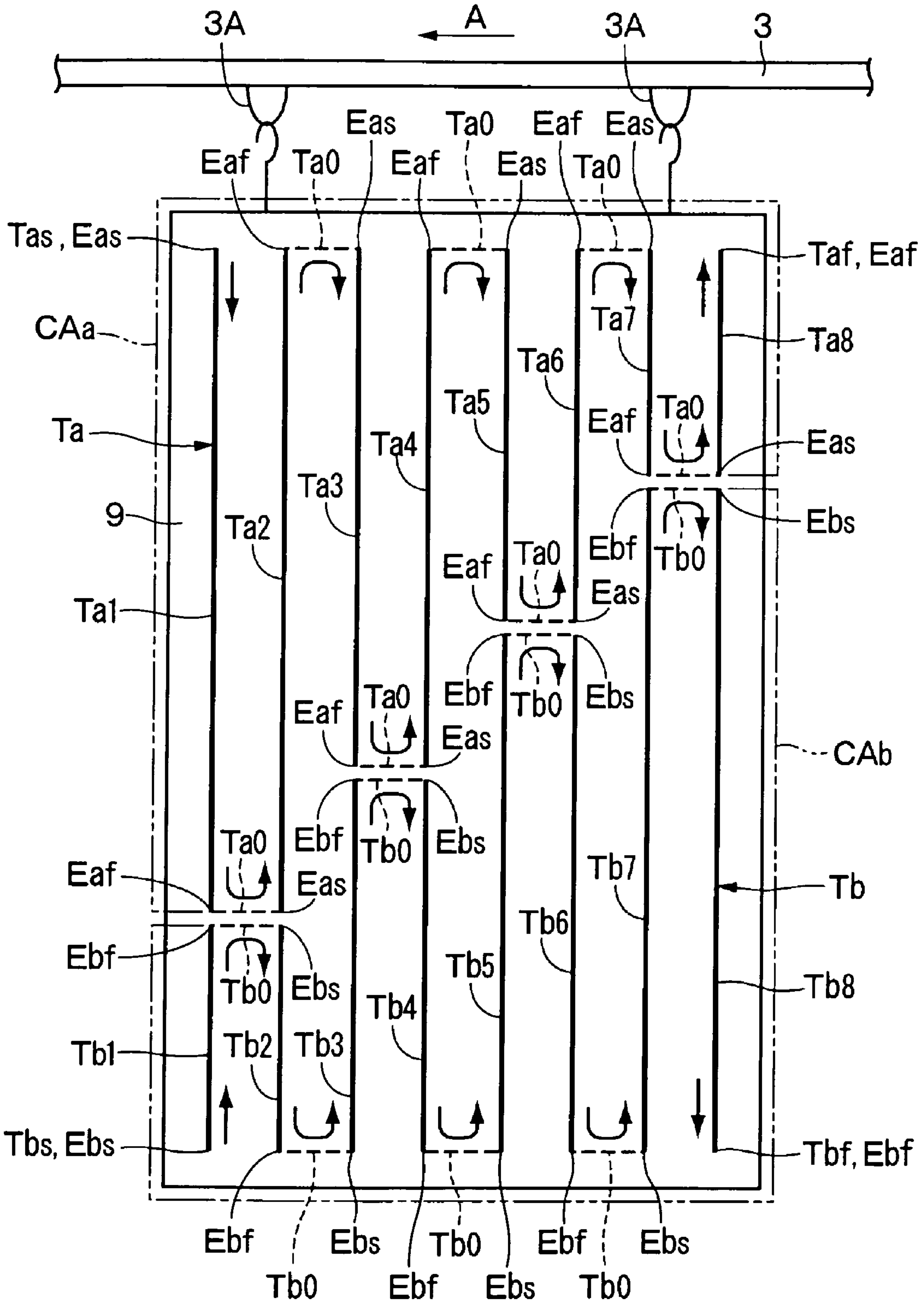
FIG. 11 is a front view of the coating trajectories of a rotary atomizing type sprayer unit coating a panel by use of a coating method according to a second embodiment.

Next, a second embodiment of the present invention is shown in FIG. 11. The feature of this embodiment is the forming of a coating trajectory, which reciprocates a sprayer unit in a perpendicular direction to the conveying direction of a panel. In the following description of this embodiment, those component parts which are identical with counterparts in the foregoing first embodiment are simply designated by the same reference numerals or characters to avoid repetitions of same explanations.

First, according to the arrangement of the second embodiment, two robot devices 4, 5 used as apparatuses for operating sprayer units in the first embodiment are employed, and the rotary atomizing type sprayer units 6, 7 that are attached to the robot devices 4, 5 are reciprocated longitudinal direction. Furthermore, in the second embodiment, a panel 9 used in the first embodiment as an object to be coated is suspended lengthwise, so that the parallel long sides of the panel 9 are vertical.

Next, while referring to FIG. 11, a coating method according to the second embodiment will be explained by using a case that the coating of the panel 9 is performed vertically as an example.

In FIG. 11, solid lines and dotted lines (broken lines), which are drawn to indicate longitudinal reciprocation across the coating surface of the panel 9, represent coating trajectories (travel trajectories) Ta, Tb, of the sprayer units 6, 7, relative to the coating surface of the panel 9 same as the first embodiment. Furthermore, the solid lines of the coating trajectories Ta, Tb represent parallel transit paths Ta1 to Ta8, Tb1 to Tb8 which the sprayer units 6, 7 move parallel to the longitudinal direction. The dotted lines of the coating trajectories Ta, Tb represent turning paths Ta0, Tb0 whereat the sprayer units 6, 7 turn and move. Further, the sprayer units 6, 7 are constituted to spray paint along the parallel transit paths Ta1 to Ta8, Tb1 to Tb8, and to cut the spraying of paint at the turning paths Ta0, Tb0. In addition, the two sprayer units 6, 7 perform coating process sequences, which will be described later, along the coating trajectories Ta, Tb at speeds corresponding to the panel 9 (the object).

During a first coating process, when the panel 9 is moved by a conveyer 3 to the vicinity of the sprayer unit 6 that is positioned to the rear side (upstream) in the conveying direction, a controller 8 begins the coating of the coating area CAa which is the upper side of the coating surface of the panel 9, for example, by using the robot device 4 (the sprayer unit 6) located to the rear in the conveying direction. At this time, the sprayer unit 6 moves to the upper left corner of the panel 9 in FIG. 11 as a start position Tas of the coating trajectory Ta, and starts the spraying of paint. Then, the sprayer unit 6 moves downward at the left side of the panel 9 along the first parallel transit path Ta1 while continuing the spraying of paint.

When the sprayer unit 6 has moved to the intermediate position of the panel 9 in longitudinal direction and has reached a terminal end Eaf of the parallel transit path Ta1, the sprayer unit 6 is positioned at the start end of the first turning path Ta0. Thus, the sprayer unit 6 temporarily cuts the spraying of paint, and moves to the right of the panel 9 along the first turning path Ta0.

Following this, when the sprayer unit 6 has moved from the parallel transit path Ta1 to the right a distance smaller than the diameter of an spray pattern P and has reached the terminal end of the first turning path Ta0, the sprayer unit 6 is positioned at a start end Eas of the second parallel transit path Ta2. Then, the sprayer unit 6 restarts the spraying of paint and moves upward of the panel 9 along the second parallel transit path Ta2 while continuing the spraying of paint.

Thus, the sprayer unit 6 repeats the longitudinal reciprocation, and gradually moves to the rearward in the conveying direction of the panel 9. Therefore, according to the second embodiment, the positions of the turning paths Ta0 located at the boundary between the coating areas CAa, CAb are sequentially shifted to upward in vertical direction. Therefore, regarding to the boundary portion between the coating areas CAa, CAb is formed like a series of steps.

Finally, when the sprayer unit 6 has moved to the terminal end Eaf of the eighth parallel transit path Ta8, the sprayer unit 6 is positioned in the upper right corner of the panel 9 in FIG. 11 as an end position Taf of the coating trajectory Ta. Thereafter, the sprayer unit 6 stops the spraying of the paint at this position, and terminates the coating of the panel 9.

On the other hand, in a second coating process, when the panel 9 is moved by the conveyer 3 to the vicinity of the sprayer unit 7 that is located to the front side (downstream) in the conveying direction, the controller 8 begins the coating of the coating area CAb which is the lower side of the coating surface of the panel 9 by using the robot device 5 (sprayer unit 7) located to the front side in the conveying direction. At this time, the sprayer unit 7 is moved to the lower left corner of the panel 9 in FIG. 11 as a start position Tbs of the coating trajectory Tb, and starts the spraying of paint. Then, the sprayer unit 7 moves upward at the left side of the panel 9 along the first parallel transit path Tb1 while the spraying of paint.

Sequentially, when the sprayer unit 7 has moved to the intermediate position of the panel 9 in longitudinal direction and has reached a terminal end Ebf of the parallel transit path Tb1, the sprayer unit 7 is positioned at the start end of the first turning path Tb0. Thus, the sprayer unit 7 temporarily cuts the spraying of paint and moves to the rightward of the panel 9 along the first turning path Tb0. At this time, the terminal end Ebf of the parallel transit path Tb1 is positioned near the terminal end Eaf of the parallel transit path Ta1, which is adjacent in longitudinal direction, and these parallel transit paths Tb1, Ta1 are aligned substantially linearly. Furthermore, the first turning path Tb0 is positioned near the turning path Ta0 that is adjacent in vertical direction, and the turning paths Tb0, Ta0 are transversely extended almost parallel to each other.

When the sprayer unit 7 has moved from the parallel transit path Tb1 to the right a distance smaller than the diameter of the spray pattern P and reached the terminal end of the first turning paths Tb0, the sprayer unit 7 restarts the spraying of paint, and moves downward of the panel 9 along the second parallel transit path Tb2 while continuing the spraying of paint.

As described above, the sprayer unit 7 repeats the longitudinal reciprocation and gradually moves to the rearward in the conveying direction of the panel 9. Therefore, according to the second embodiment, the positions of the turning paths Tb0 positioned at the boundary between the coating areas CAa, CAb are sequentially shifted upward in vertical direction. Therefore, regarding to the coating trajectory Tb, the boundary portion between the coating areas CAa, CAb is formed like a series of steps.

Finally, when the sprayer unit 7 has moved to the terminal end Ebf of the eighth parallel transit path Tb8, the sprayer unit 7 is positioned at the lower right corner of the panel 9 in FIG. 11 as an end position Tbf of the coating trajectory Tb. Thereafter, the sprayer unit 7 stops the spraying of paint at this position, and terminates the coating of the panel 9.

Thus, with the above described arrangement in the second embodiment, substantially the same operational effects can be acquired as are obtained in the first embodiment.

Figure 12:
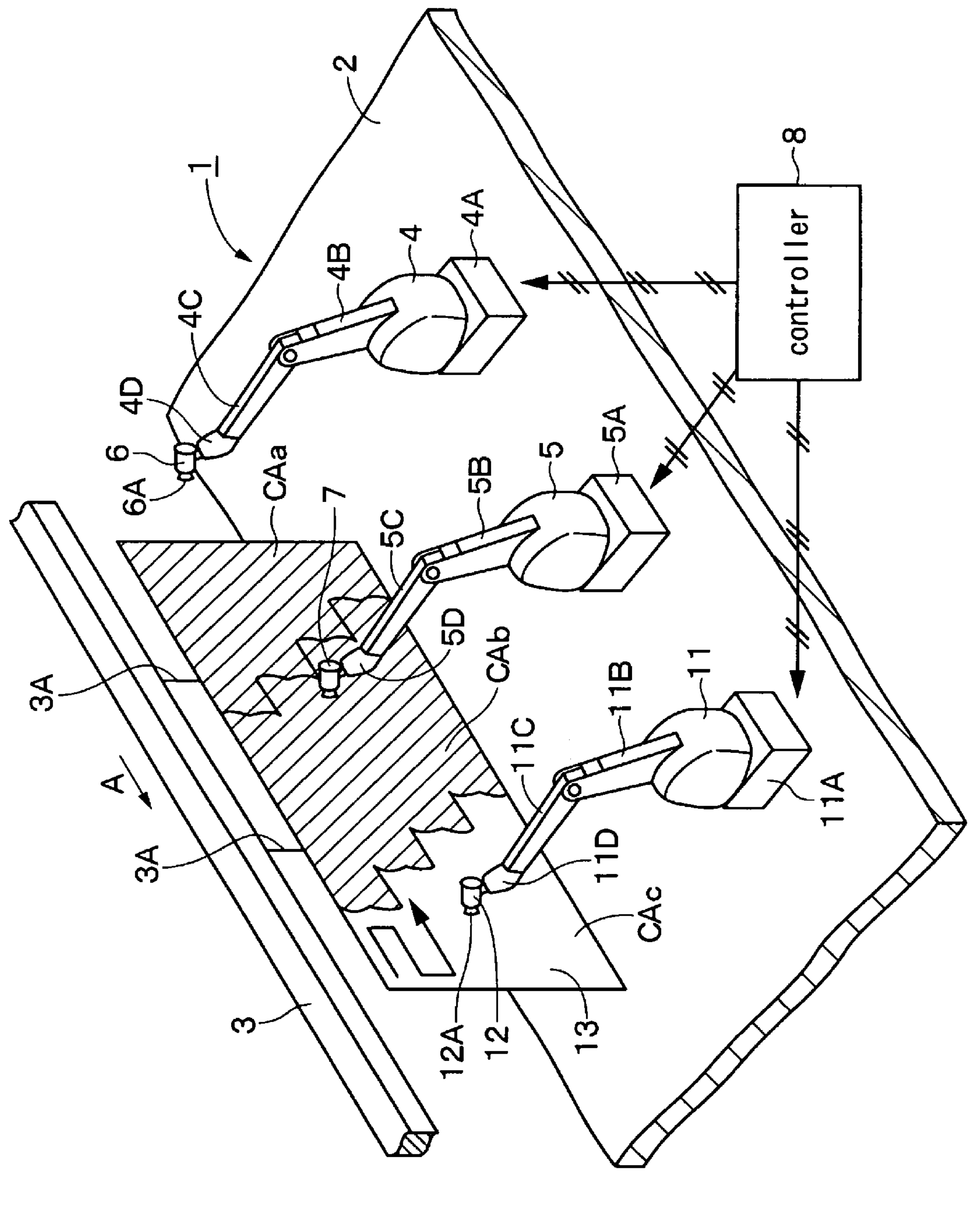
FIG. 12 is a perspective view of a coating apparatus used for a coating method according to a third embodiment.
Figure 13:
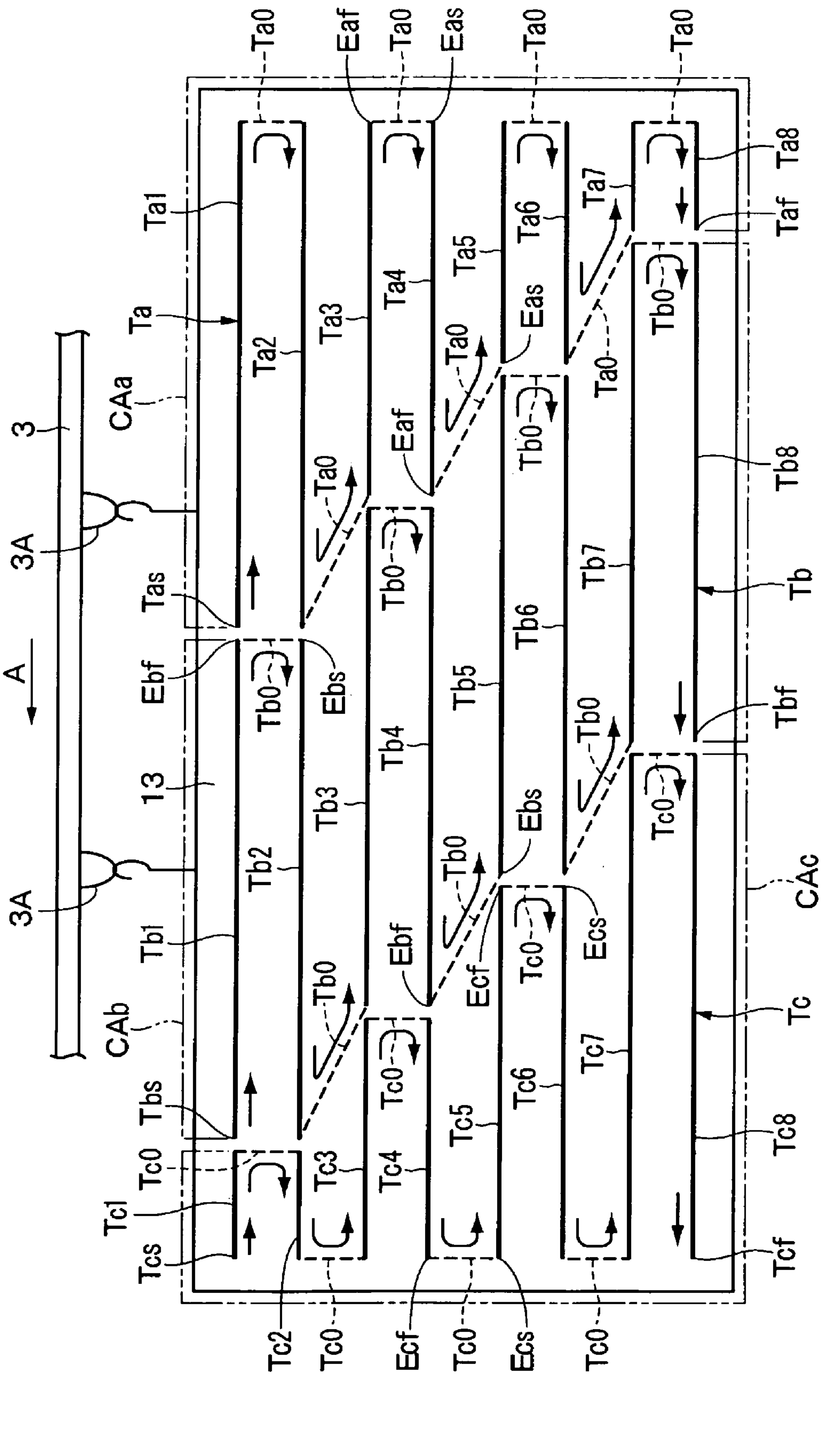
FIG. 13 is a front view of the coating trajectories of a rotary atomizing type sprayer unit for coating a panel by use of a coating method according to the third embodiment.

A third embodiment of the present invention is shown in FIGS. 12 and 13. The feature of this embodiment is that coating is performed by dividing a panel into three coating areas. In the following description of this embodiment, those component parts which are identical with counterparts in the foregoing first embodiment are simply designated by the same reference numerals or characters to avoid repetitions of same explanations.

In the third embodiment, as shown in FIG. 12, a robot device 11 which is substantially the same as the robot devices 4, 5 used in the first embodiment is additionally provided as an apparatus operating an sprayer unit, and a total of three robot devices 4, 5, 11 are employed. Further, rotary atomizing type sprayer units 6, 7, 12 attached to the robot devices 4, 5, 11 are to reciprocate laterally (in the conveying direction).

Further, in the third embodiment, a panel 13 which lengthwise is longer than the panel 9 used in the first embodiment is employed as an object to be coated. The coating surface of the panel 13 is divided into three coating areas CAa, CAb, CAc, that are located to the rear, in the middle and to the front in the conveying direction, and those are to be coated by the respective sprayer units 6, 7, 12 arranged to the rear, in the middle and to the front in the conveying direction.

Next, while referring to FIG. 13, a coating method of the third embodiment will be explained by using a case that a coating is applied to the large panel 13 as an example.

In FIG. 13, as in the first embodiment, solid lines and dotted lines (broken lines), which are drawn to describe reciprocation in lateral direction on the coating surface of the panel 13, represent coating trajectories (travel trajectories) Ta, Tb, Tc of the sprayer units 6, 7, 12 relative to the coating surface of the panel 13. Furthermore, the solid lines of the coating trajectories Ta, Tb, Tc represent parallel transit paths Ta1 to Ta8, Tb1 to Tb8, Tc1 to Tc8 that the sprayer units 6, 7, 12 move parallel to the lateral direction. The dotted lines of the coating trajectories Ta, Tb, Tc represent turning paths Ta0, Tb0, Tc0 where the sprayer units 6, 7, 12 turn and move. Further, the sprayer units 6, 7, 12 are constituted to spray paint along the parallel transit paths Ta1 to Ta8, Tb1 to Tb8, Tc1 to Tc8 and to cut the spraying of paint at the turning paths Ta0, Tb0, Tc0. In addition, the three sprayer units 6, 7, 12 perform coating process sequences along the coating trajectories Ta, Tb, Tc, while maintaining speeds corresponding to that of the panel 13 (the object), which will be described later.

During a first coating process, when the panel 13 is moved by a conveyer 3 to the vicinity of the sprayer unit 6 located to the rear side (the furthest upstream) in the conveying direction, a controller 8 begins coating of the coating area CAa which is the rear side of the coating surface of the panel 13 in the conveying direction by using the robot device 4 located to the rear side in the conveying direction. At this time, the sprayer unit 6 moves to the intermediate position in lateral direction in FIG. 13, to the vicinity of a terminal end Ebf of the first parallel transit path Tb1 on the upper side of the panel 13 as a start position Tas of a coating trajectory Ta, and begins the spraying of paint. Then, the sprayer unit 6 moves to the right of the upper side of the panel 13 along the first parallel transit path Ta1, while continuing spraying of the paint.

Next, when the sprayer unit 6 has moved to the right end of the panel 13 and has reached the terminal end Eaf of the parallel transit path Ta1, the sprayer unit 6 temporarily cuts the spraying of paint and moves downward on the panel 13 along the first turning path Ta0.

When the sprayer unit 6 has moved down from the parallel transit path Ta1 a distance smaller than the diameter of a spray pattern P, the sprayer unit 6 reaches the terminal end of the turning path Ta0. The sprayer unit 6 resumes the spraying of paint and moves to the left of the panel 13 along the second parallel transit path Ta2 while continuing the spraying of paint.

As described above, the sprayer unit 6 repeats the lateral reciprocation, and gradually moves downward on the panel 13. Therefore, also in the third embodiment, the positions of the turning paths Ta0 located at the boundary between the coating areas CAa, CAb are sequentially shifted from the front side to the rear side in the conveying direction. Therefore, the side of the boundary between the coating areas CAa, CAb of the coating trajectory Ta has a step-like form.

Finally, when the sprayer unit 6 has moved to the terminal end Eaf of the eighth parallel transit path Ta8, the sprayer unit 6 is positioned at the intermediate position in the lower portion of the panel 13 in FIG. 13, as an end position Taf of the coating trajectory Ta. Thereafter, the sprayer unit 6 stops the spraying of paint at this position, and terminates the coating of the panel 13.

Next, in a second coating process, the panel 13 is moved by the conveyer 3 to the vicinity of one of the three sprayer units 6, 7, 12, i.e., the sprayer unit 7 that is located in the middle in the conveying direction. Then, the controller 8 begins coating of the coating area CAb that is the middle portion of the coating surface of the panel 13 in the conveying direction by using the robot device 5 located in the middle. At this time, as a start position Tbs of the coating trajectory Tb, the sprayer unit 7 moves to the intermediate position in lateral direction in FIG. 13, in the vicinity of a terminal end Ecf of the first parallel transit path Tc1 on the upper portion of the panel 13, and starts the spraying of paint. Then, the sprayer unit 7 moves to the right across the upper portion of the panel 13 along the first parallel transit path Tb1 while continuing the spraying of paint.

Sequentially, when the sprayer unit 7 has moved a distance equivalent to a predetermined stroke width and has reached the terminal end Ebf of the parallel transit path Tb1, the sprayer unit 7 is positioned in the vicinity of a start end Eas of the parallel transit path Ta1. Therefore, the sprayer unit 7 temporarily cuts the spraying of paint and moves downward on the panel 13 along the first turning path Tb0.

Following this, when the sprayer unit 7 has moved down from the parallel transit path Tb1 a distance equivalent to the first turning path Ta0, the sprayer unit 7 reaches the terminal end of the first turning path Tb0. Then, the sprayer unit 7 resumes the spraying of paint and moves to the left on the panel 13 along the second parallel transit path Tb2 while continuing the spraying of paint. As described above, the sprayer unit 7 repeats the lateral reciprocation, and gradually moves downward on the panel 13.

At this time, the positions of the four turning paths Tb0, which are located at the boundary between the two coating areas CAa, CAb, are sequentially shifted from the front side to the rear side in the conveying direction. Also, the positions of the three turning paths Tb0, which are located at the boundary between the coating areas CAb, CAc, are sequentially shifted from the front side to the rear side in the conveying direction. Therefore, regarding to the coating trajectory Tb, the portion on the side of the boundary between the two coating areas CAa, CAb is formed like a series of steps, and the portion on the side of the boundary between the coating areas CAb, CAc also is formed like a series of steps. As a whole, the coating trajectory Tb is shaped like a parallelogram.

Finally, the sprayer unit 7 moves to the terminal end Ebf of the eighth parallel transit path Tb8. Then, as an end position Tbf of the coating trajectory Tb, the sprayer unit 7 is positioned at an intermediate position in lateral direction in FIG. 13, which is in the vicinity of a start end Ecs of the eighth parallel transit path Tc8 in the lower portion of the panel 13. Thereafter, the sprayer unit 7 stops the spraying of paint at this position, and terminates the coating of the panel 13.

Further, during a third coating process, the panel 13 is moved by the conveyer 3 to the vicinity of the sprayer unit 6 located to the front side (downstream) in the conveying direction. Then, the controller 8 begins the coating of the coating area CAc that is the front portion of the coating surface of the panel 13 in the conveying direction by using the robot device 4 arranged to the front in the conveying direction. At this time, the sprayer unit 6 moves to the upper left corner of the panel 13 in FIG. 13 as a start position Tcs of the coating trajectory Tc, and starts the spraying of paint. Then, the sprayer unit 6 moves to the right across the upper side of the panel 13 along the first parallel transit path Tc1 while continuing the spraying of paint.

Sequentially, when the sprayer unit 6 has moved to an intermediate position of the panel 13 in lateral direction, and has reached a terminal end Ecf of the parallel transit path Tc1, the sprayer unit 6 is positioned in the vicinity of a start end Ebs of the parallel transit path Tb1. Then, the sprayer unit 6 temporarily cuts the spraying of paint, and moves downward on the panel 13 along the first turning path Tc0.

When the sprayer unit 6 has moved down from the parallel transit path Tc1 a distance equivalent to the first turning path Ta0, Tb0, the sprayer unit 6 reaches the terminal end of the first turning path Tc0. Therefore, the sprayer unit 6 resumes the spraying of paint and moves to the left on the panel 13 along the second parallel transit path Tc2 while continuing the spraying of paint.

As described above, the sprayer unit 6 repeats the lateral reciprocation, and gradually moves downward on the panel 13. Therefore, the positions of the turning paths Tc0, which are located at the boundary between the two coating areas CAb, CAc, are sequentially shifted from the front side to the rear side in the conveying direction. As a result, regarding to the coating trajectory Tc, the boundary portion between the coating areas CAb, CAc has a step-like form.

Finally, when the sprayer unit 6 has moved to the terminal end Ecf of the eighth parallel transit path Tc8, the sprayer unit 6 is positioned at the lower left corner of the panel 13 in FIG. 13 as an end position Tcf of the coating trajectory Tc. Thereafter, the sprayer unit 6 stops the spraying of the paint at this position, and terminates the coating of the panel 13.

Thus, in the third embodiment also, with the above described arrangement, substantially the same operational effects can be acquired as the first embodiment.

Figure 14:
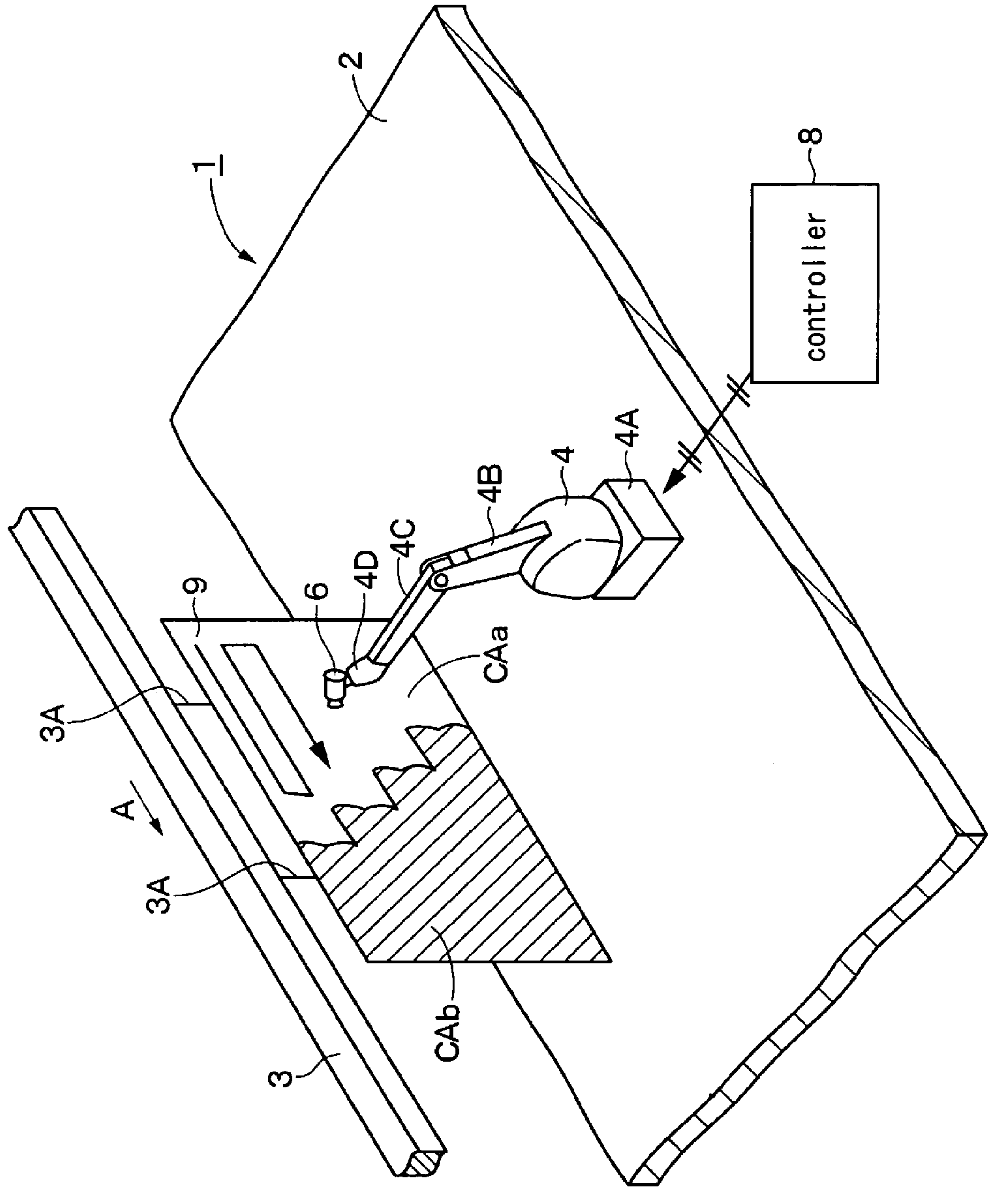
FIG. 14 is a perspective view of a coating apparatus used for a coating method according to a fourth embodiment.
Figure 15:
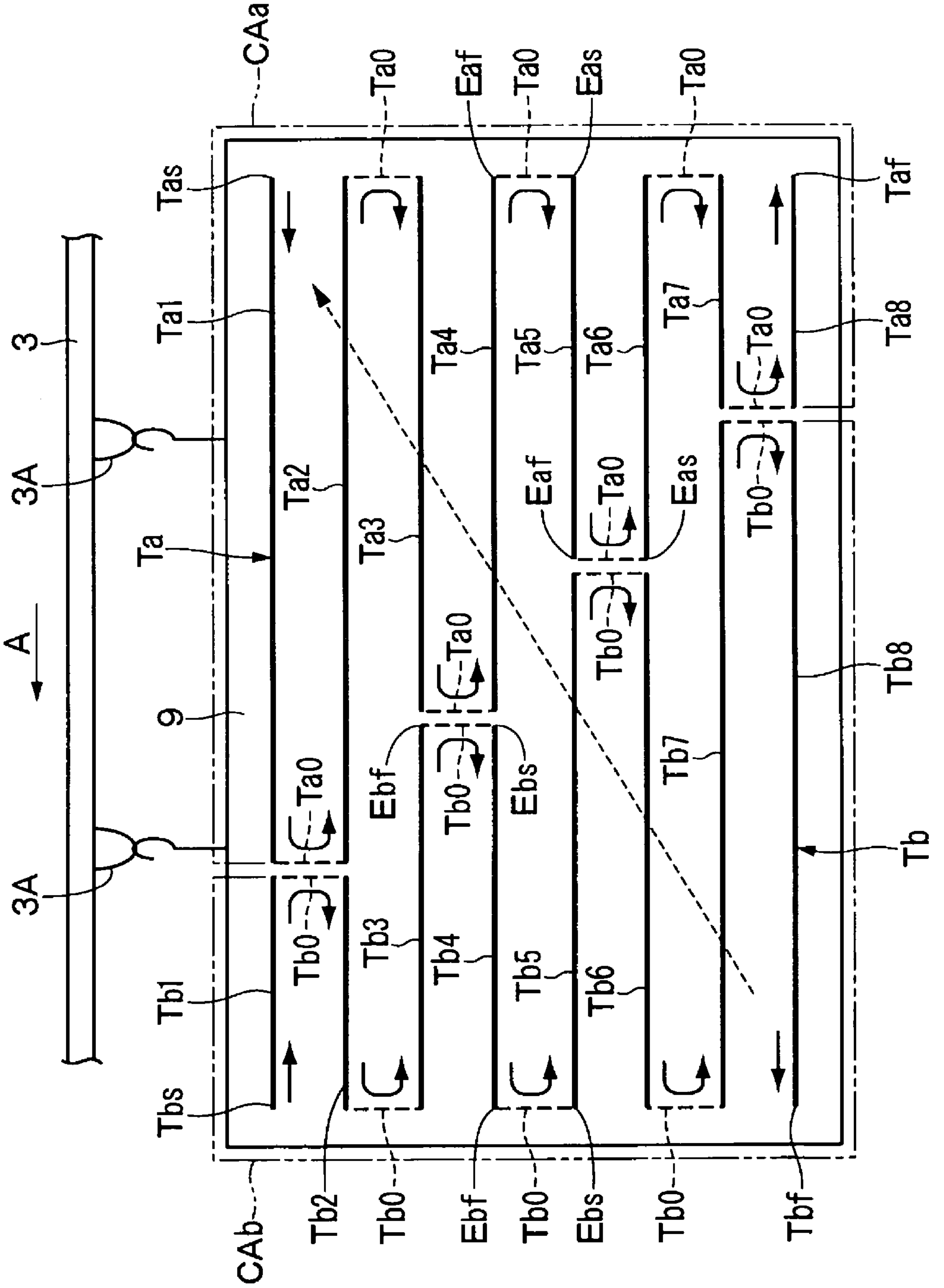
FIG. 15 is a front view of the coating trajectories of a rotary atomizing type sprayer unit for coating a panel by use of a coating method according to a fourth embodiment.

A fourth embodiment of the present invention is shown in FIGS. 14 and 15. The feature of this embodiment is that a single sprayer unit is provided to apply paint to a plural number of coating areas. In the following description of this embodiment, those component parts which are identical with counterparts in the foregoing first embodiment are simply designated by the same reference numerals or characters to avoid repetitions of same explanations.

In the fourth embodiment, one robot device 4 used in the first embodiment is employed as a device for operating a sprayer unit, and a rotary atomizing type sprayer unit 6 attached to the robot device 4 is to be reciprocated laterally. Further, in the fourth embodiment, a panel 9 used in the first embodiment is employed as an object to be coated.

While referring to FIG. 15, a coating method of the fourth embodiment will be explained by employing, as an example, a case wherein the panel 9 is coated. In this embodiment, it is different from the first embodiment that the coating of a coating area CAb is performed in a first coating process and the coating of the coating area CAa is performed in a second coating process.

First, in FIG. 15, as in the first embodiment, solid lines and dotted lines (broken lines), which are drawn to indicate reciprocation across the coating surface of the panel 9 in the lateral direction, represent coating trajectories (travel trajectories) Ta, Tb of the sprayer unit 6 relative to the coating surface of the panel 9. Furthermore, the solid lines of the coating trajectories Ta, Tb represent parallel transit paths Ta1 to Ta8, Tb1 to Tb8 which the sprayer unit 6 moves parallel to the lateral direction. The dotted lines of the coating trajectories Ta, Tb represent turning paths Ta0, Tb0 which the sprayer unit 6 turns and moves. Further, the sprayer unit 6 is employed to spray paint on the parallel transit paths Ta1 to Ta8, Tb1 to Tb8 and to cut the spraying of paint at the turning paths Ta0, Tb0. In addition, the sprayer unit 6 performs the coating process sequences along the coating trajectories Ta, Tb while maintaining a speed corresponding to that of the panel 9 (object), which will be described later.

The first coating process is performed to apply paint to the coating area CAb. When the panel 9 is moved by a conveyer 3 to the vicinity of the sprayer unit 6, a controller 8 starts coating of the coating area CAb which is the front portion of the coating surface of the panel 9 in the conveying direction by using on robot device 4. At this time, the sprayer unit 6 moves to the upper left corner of the panel 9 in FIG. 15 as a start position Tbs of the coating trajectory Tb, and begins spraying paint. Then, the sprayer unit 6 moves to the right across the upper side of the panel 9 along the first parallel transit path Tb1 while continuing the spraying of paint.

When the sprayer unit 6 has moved adjacent to the intermediate position of the panel 9 in lateral direction, the sprayer unit 6 reaches a terminal end Ebf of the parallel transit path Tb1. Then, the sprayer unit 6 temporarily cuts the spraying of paint and moves downward on the panel 9 along the first turning path Tb0.

Following this, when the sprayer unit 6 has moved down from the parallel transit path Tb1 a distance smaller than the diameter of an spray pattern P, the sprayer unit 6 reaches the terminal end of the first turning path Tb0. Therefore, the sprayer unit 6 resumes the spraying of paint and moves to the left of the panel 9 along the second parallel transit path Tb2 while continuing the spraying of paint.

As described above, the sprayer unit 6 repeats the lateral reciprocation, and gradually moves downward on the panel 9. Therefore, the positions of the turning paths Tb0, which are located at the boundary between the coating areas CAa, CAb, are sequentially shifted from the front to the rear in the conveying direction. As a result, regarding to the coating trajectory Tb, the boundary portion between the coating areas CAa, CAb has a step-like form.

Sequentially, when the sprayer unit 6 has moved to the terminal end Ebf of the parallel transit path Tb8, the sprayer unit 6 is positioned at the lower left corner of the panel 9 in FIG. 15 as an end position Tbf of the coating trajectory Tb. Thereafter, the sprayer unit 6 stops the spraying of paint at this position, and moves to a start position Tas of the coating trajectory Ta for the next coating area CAa.

The following second coating process is performed to apply paint to the coating area CAa. When the painting of the coating area CAb has been completed, the sprayer unit 6 starts the coating of the coating area CAa which is the rear portion of the coating surface of the panel 9 in the conveying direction. At this time, since the panel 9 is constantly conveyed by the conveyer 3, during the coating of the coating area CAb, the panel 9 is moved to the front in the conveying direction, and the rear portion of the panel 9 in the conveying direction is moved to the vicinity of the sprayer unit 6. Therefore, the sprayer unit 6 can apply paint to the coating area CAa at the rear side in the conveying direction.

To start the coating of the coating area CAa, the sprayer unit 6 moves to the upper right corner of the panel 9 in FIG. 15 as the start position Tas of the coating trajectory Ta, and begins spraying paint. Then, the sprayer unit 6 moves to the left across the upper side of the panel 9 along the first parallel transit path Ta1 while continuing the spraying of paint.

Sequentially, when the sprayer unit 6 has moved to the intermediate position in lateral direction of the panel 9, the sprayer unit 6 reaches the terminal end Eaf of the parallel transit path Ta1. Then, the sprayer unit 6 temporarily cuts the spraying of paint and moves downward on the panel 9 along the first turning path Ta0. At this time, the terminal end Eaf of the parallel transit path Ta1 is located near the terminal end Ebf of the parallel transit path Tb1 which is laterally adjacent, and these parallel transit paths Tb1, Ta1 are aligned substantially linearly. Further, the first turning path Ta0 is located near the turning path Tb0 that is laterally adjacent, and the turning paths Ta0, Tb0 are vertically extended substantially parallel to each other.

Following this, when the sprayer unit 6 has moved down from the parallel transit path Ta1 a distance equivalent to the first turning path Tb0, the sprayer unit 6 reaches the terminal end of the first turning path Ta0. At this point, the sprayer unit 6 resumes the spraying of paint and moves to the right of the panel 9 along the second parallel transit path Ta2, while continuing the spraying of paint.

As described above, the sprayer unit 6 repeats the lateral reciprocation, and gradually moves downward on the panel 9. Therefore, the positions of the turning paths Ta0, which are located at the boundary between the coating areas CAa, CAb, are sequentially shifted from the front side to the rear side in the conveying direction. As a result, regarding to the coating trajectory Ta, the boundary portion between the coating areas CAa, CAb is formed like a series of steps.

Finally, when the sprayer unit 6 has moved to the terminal end Eaf of the eighth parallel transit path Ta8, the sprayer unit 6 is positioned at the lower right corner of the panel 9 in FIG. 15 as an end position Taf of the coating trajectory Ta. Thereafter, the sprayer unit 6 stops the spraying of the paint at this position, and terminates the coating of the panel 9.

Thus, also in the fourth embodiment having the above described arrangement, substantially the same operational effects can be acquired as are obtained in the first embodiment. Especially, since according to the arrangement in the fourth embodiment, a plural number of coating areas CAa, CAb are coated by one sprayer unit 6, when the speed of conveying the panel 9 is comparatively slow, the coating of a large coating surface can be performed by a single sprayer unit 6. Therefore, the number of sprayer unit 6 can be reduced and equipment costs for the coating apparatus 1 (the entire coating line), maintenance costs can also be reduced.

In the configuration of the fourth embodiment, only one sprayer unit 6 is employed. However, when two sprayer units 6, 7 are arranged in the conveying direction as in the first embodiment, the two sprayer units 6, 7 may coat multiple coating areas CAa, CAb, respectively. With this arrangement, the entire coating surface of the panel 9 can be coated twice.

Figure 16:
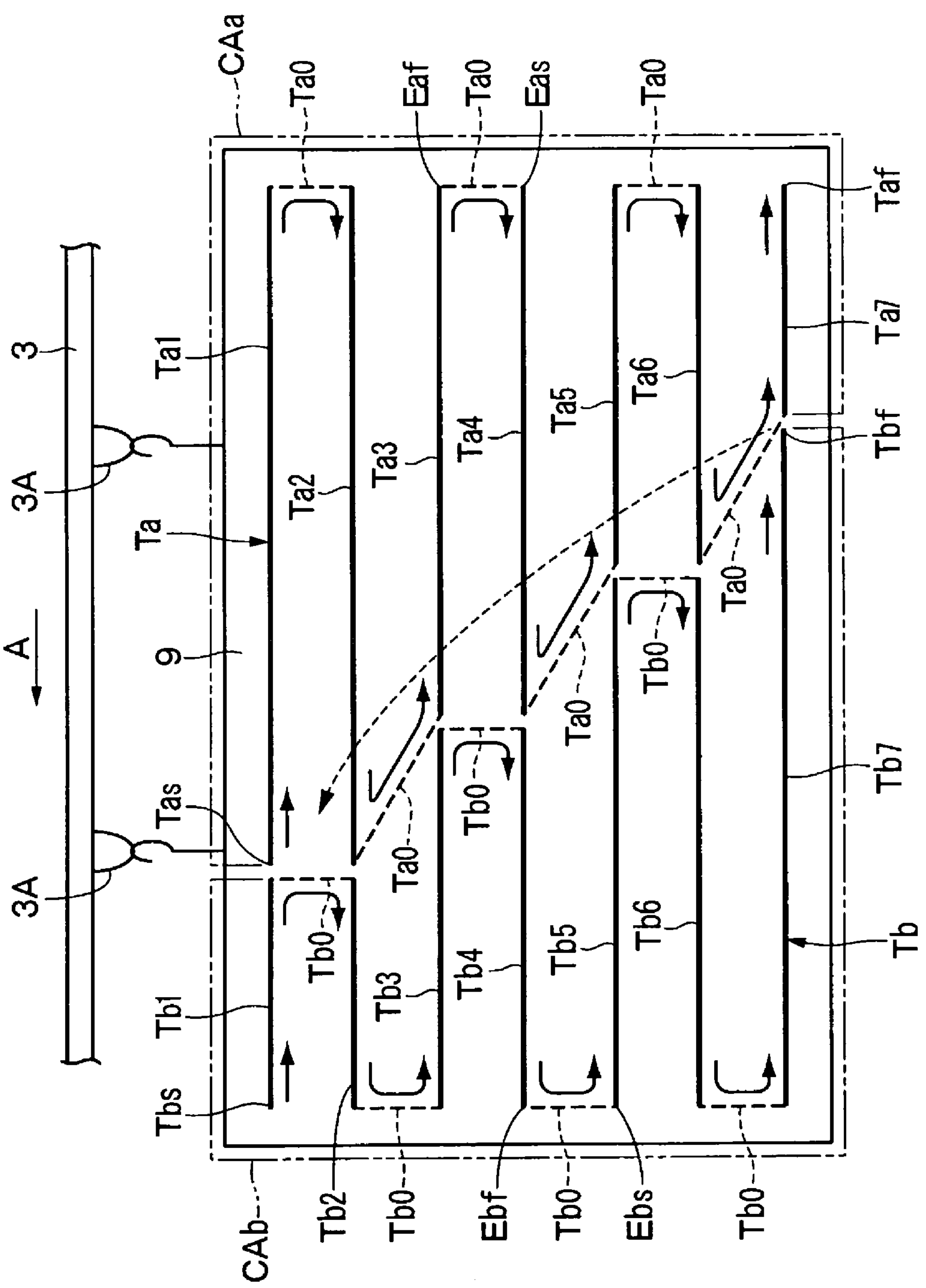
FIG. 16 is a front view of the coating trajectories of a rotary atomizing type sprayer unit for coating a panel by use of a coating method according to a fifth embodiment.

A fifth embodiment of the present invention is shown in FIG. 16. The feature of this embodiment is an arrangement that a single sprayer unit is employed to coat a plural number of coating areas, and when the coating areas are changed from one coating area to another coating area, the end position of one coating trajectory is brought close to the start position of another coating trajectory in order to reduce the time that the spraying of paint is halted. In the following description of this embodiment, those component parts which are identical with counterparts in the foregoing first embodiment are simply designated by the same reference numerals or characters to avoid repetitions of same explanations.

First, according to the arrangement of the fifth embodiment, one robot device 4 used in the first embodiment as an apparatus for operating a sprayer unit is employed, and a rotary atomizing type sprayer unit 6 attached to the robot device 4 is to be reciprocated laterally. Furthermore, in the fifth embodiment, a panel 9 used in the first embodiment is employed as an object to be coated.

Next, referring to FIG. 16, a coating method for the fifth embodiment will now be described by using a case of the coating of the panel 9 as an example. In this embodiment, it is different from the first embodiment that coating of a coating area CAb is performed in a first coating process, and coating of a coating area CAb is performed in a second coating process.

First, in FIG. 16, as in the first embodiment, solid lines and dotted lines (broken lines) drawn to indicate a reciprocation across the coating surface of the panel 9 in the lateral direction, represent coating trajectories (travel trajectories) Ta, Tb of the sprayer unit 6 on the coating surface of the panel 9. Furthermore, the solid lines of the coating trajectories Ta, Tb, represent parallel transit paths Ta1 to Ta7, Tb1 to Tb7 that the sprayer unit 6 moves parallel in the lateral direction. The dotted lines of the coating trajectories Ta, Tb represent turning paths Ta0, Tb0, that the sprayer unit 6 turns and moves. Further, the sprayer unit 6 sprays paint on the parallel transit paths Ta1 to Ta7, Tb1 to Tb7 and cuts the spraying of paint at the turning paths Ta0, Tb0. In addition, the sprayer unit 6 performs the coating process sequences along the coating trajectories Ta, Tb while maintaining a speed corresponding to that of the panel 9 (object), which will be described later.

The first coating process is performed to coat the coating area CAb. When the panel 9 is moved by a conveyer 3 to the vicinity of the sprayer unit 6, a controller 8 begins coating the coating area CAb which is the front portion of the coating surface on the panel 9 in the conveying direction by using the single robot device 4. At this time, the sprayer unit 6 moves to the upper left corner of the panel 9 in FIG. 16 as a start position Tbs of the coating trajectory Tb, and starts spraying paint. Then, the sprayer unit 6 moves to the right across the upper side of the panel 9 along the first parallel transit path Tb1 while continuing the spraying of paint.

Next, when the sprayer unit 6 has moved to the intermediate position in lateral direction of the panel 9 and has reached a terminal end Ebf of the parallel transit path Tb1, the sprayer unit 6 temporarily cuts the spraying of paint and moves downward on the panel 9 along the first turning path Tb0.

Sequentially, when the sprayer unit 6 has moved down from the parallel transit path Tb1 a distance smaller than the diameter of a spray pattern P, the sprayer unit 6 reaches the terminal end of the first turning path Tb0. Thereafter, the sprayer unit 6 resumes the spraying of paint and moves to the left of the panel 9 along the second parallel transit path Tb2 while continuing the spraying of paint.

As described above, the sprayer unit 6 repeats the lateral reciprocation and gradually moves downward on the panel 9. In this case, the positions of the three turning paths Tb0, which are located at the boundary between the coating areas CAa, CAb, are sequentially shifted from the front side to the rear side in the conveying direction. As a result, the portion on the side of the boundary between the coating areas CAa, CAb of the coating trajectory Tb is formed like a series of steps.

When the sprayer unit 6 has moved to the terminal end Ebf of the seventh parallel transit path Tb7, the sprayer unit 6 is positioned at the intermediate position in lateral direction on the lower portion of the panel 9 in FIG. 16, as an end position Tbf of the coating trajectory Tb. Thus, the sprayer unit 6 stops the spraying of paint at this position and moves to a start position Tas of the coating trajectory Ta on the next coating area CAa.

The following second coating process is performed to coat the coating area CAa. When the coating of the coating area CAb has been completed, the sprayer unit 6 starts the coating of the coating area CAa of the coating surface of the panel 9 that is defined on the upstream side. At this time, since the panel 9 is constantly conveyed by the conveyer 3, during the coating operation for the coating area CAb, the panel 9 is moved to the front side in the conveying direction and the rear portion of the panel 9 in the conveying direction is positioned near the sprayer unit 6. Thus, the sprayer unit 6 can coat the coating area CAa that is defined at the rear side in the conveying direction.

When the coating of the coating area CAa is to begin, the sprayer unit 6 moves to the vicinity of the terminal end Ebf of the parallel transit path Tb1 of the upper side of the panel 9 as a start position Tas of the coating trajectory Ta, and starts spraying paint at this point. Thereafter, the sprayer unit 6 moves to the right across the upper side of the panel 9 along the first parallel transit path Ta1 while continuing the spraying of paint.

Following this, when the sprayer unit 6 has moved to the left end of the panel 9, the sprayer unit 6 reaches the terminal end Eaf of the parallel transit path Ta1. Then, the sprayer unit 6 temporarily cuts the spraying of paint and moves downward on the panel 9 along the first turning path Ta0.

Sequentially, when the sprayer unit 6 has moved down from the parallel transit path Ta1 a distance equivalent to the first turning path Tb0, the sprayer unit 6 reaches the terminal end of the first turning path Ta0. Thereafter, the sprayer unit 6 resumes the spraying of paint and moves to the left of the panel 9 along the second parallel transit path Ta2 while continuing the spraying of paint.

As described above, the sprayer unit 6 repeats the lateral reciprocation and gradually moves downward on the panel 9. Therefore, the positions of the turning path Ta0, which are located at the boundary between the coating areas CAa, CAb, are sequentially shifted from the front side to the rear side in the conveying direction. As a result, the side of the boundary between the coating areas CAa, CAb of the coating trajectory Ta is formed like a series of steps.

Finally, when the sprayer unit 6 has moved to the terminal end Eaf of the parallel transit path Ta7, the sprayer unit 6 is positioned at the lower right corner of the panel 9 in FIG. 16 as an end position Taf of the coating trajectory Ta. Thus, the sprayer unit 6 stops the spraying of paint at this position, and completes the coating of the panel 9.

In conclusion, also in the fifth embodiment having the above described arrangement, substantially the same operational effects can be achieved as are obtained in the first and fourth embodiment. Especially in the fifth embodiment, the end position Tbf of the first coating trajectory Tb and the start position Tas of the next coating trajectory Ta are located in the intermediate position in lateral direction of the panel 9 to reduce the distance between the end position Tbf and the start position Tas. Therefore, it is possible to reduce the period of time during which the spraying of paint is stopped when the sprayer unit 6 moves from the end position Tbf to the start position Tas. The coating time period can also be reduced, and productivity can be increased.

In the arrangement in the fifth embodiment, both the end position Tbf of the first coating trajectory Tb and the start position Tas of the next coating trajectory Ta have been located in the intermediate position in lateral direction of the panel 9. However, the present invention is not limited to this arrangement. So long as the distance between the end position Tbf and the start position Tas can be shortened, the start position Tas may be located at the upper right corner of the panel 9 while the end position Tbf is located in an intermediate position in lateral direction of the panel 9.

Further, in the arrangement of the first and the second embodiments, the coating trajectories Ta, Tb have been moved opposite sides each other like the parallel transit paths Ta1, Tb1. However, the present invention is not limited to the arrangements. For example, as in the fifth embodiment, the coating trajectory Tb may be moved in the same direction as the coating trajectory Ta.

Furthermore, in the first and the third to the fifth embodiments, the coating trajectories Ta, Tb, Tc have been formed from the top to the bottom of the panel 9 or 13. However, the coating trajectories may be formed from the bottom to the top. Also in this case, it is preferable that the positions of the turning paths located at the boundary between the adjacent coating areas are shifted sequentially from the front side to the rear side in the conveying direction.

In addition, in the arrangements for the individual embodiments, the spraying of paint has been cut at the turning paths Ta0, Tb0, Tc0 of the coating trajectories Ta, Tb, Tc. However, the present invention is not limited to this arrangement, and the spraying of paint may be continued at the turning paths of the coating trajectories. In this case, at the boundary between two adjacent coating areas, a predetermined interval is extended between the turning path of one of the coating areas and the turning path of the other coating area to prevent an increase the thickness of a coated film at the boundary.

Moreover, according to the arrangements of the individual embodiments, the panel 9 or 13 having the shape of a plate has been coated. However, another object can be employed if the coating surface is large and can be divided into a plural number of coating areas. In this case, the body of an automobile can also be employed, for example.

Also, according to the arrangements of the individual embodiments, coating has been performed of the panel 9 or 13 conveyed by the conveyer 3. However, the present invention is not limited to these arrangements, and coating may be performed of a panel that is halted.

Further, according to the arrangements of the individual embodiments, the rotary atomizing type sprayer units 6, 7, 12 have been employed. However, a sprayer unit of a spray gun type may be used, and not only an electrostatic coating apparatus, but also another type of coating apparatus may be used.

The invention claimed is:

1. A coating method for coating a surface of an object, comprising:

- dividing said coating surface into a plural number of coating areas;
- sequentially shifting positions of a first set of turning paths for reciprocation of at least one sprayer unit in one of two directions of said reciprocation and coating a specific area of said divided coating areas, while forming a coating trajectory of said turning paths like a series of steps such that each successive one of the turning paths of the at least one sprayer unit along one edge of the specific coating area extends further in a first direction than each previous one of the turning paths along the one edge of the specific coating area; and
- sequentially shifting positions of a second set of turning paths, which are adjacent to and face the first set of turning paths, for reciprocation of said at least one sprayer unit in said one direction to avoid overlapping with said first set of turning paths in said specific coating area and coating a different coating area which is adjacent to said specific coating area while forming a coating trajectory of said second set of turning paths like a series of steps such that each successive one of the second set of turning paths along one edge of the different coating area, adjacent to the one edge of the specific coating area extends less in a second direction opposite to the first direction than each previous one of the second set of turning paths along the one edge of the different coating area to completely coat the object between the one edge of the specific coating area and the one edge of the different coating area by the coating the specific area and the coating the different coating area.

2. A coating method as defined in claim 1, wherein the coating the specific coating area and the coating the different coating area are performed in a manner such that paint is sprayed by said at least one sprayer unit at parallel transit path and is cut at said turning paths for said reciprocation during said reciprocation of said at least one sprayer unit.

3. A coating method as defined in claim 1, further comprising:

moving said object to be coated in a predetermined conveying direction via conveying means, wherein, while said at least one sprayer unit reciprocated in a direction substantially parallel to said conveying direction of said object to be coated, locations of said first and second set of turning paths are sequentially shifted from a front side to the rear side in said conveying direction of said object.

4. A coating method as defined in claim 1, wherein the first set of turning paths each link two parallel transit paths for the reciprocation of the at least one sprayer unit and each successive transit path is shorter than a previous transit path.

5. A coating method as defined in claim 4, wherein the second set of turning paths each link two parallel transit paths for the reciprocation of the at least one sprayer unit and each successive transit path is longer than a previous transit path.

6. A coating method as defined in claim 1, further comprising:

moving said object to be coated in a predetermined conveying direction, wherein, while said at least one sprayer unit reciprocated in a direction substantially perpendicularly to said conveying direction of said object to be coated, locations of said first and second set of turning paths are sequentially shifted from a front side to the rear side in said conveying direction of said object.

7. A coating method as defined in claim 1, wherein the first set of turning paths are parallel to the second set of turning paths.

* * * * *